US012640175B2

(12) United States Patent
Song et al.

(10) Patent No.: US 12,640,175 B2
(45) **Date of Patent: *May 26, 2026**

(54) BUFFER CHIP, SEMICONDUCTOR PACKAGE INCLUDING BUFFER CHIP AND MEMORY CHIP, MEMORY MODULE, AND OPERATION METHOD OF SEMICONDUCTOR PACKAGE

(71) Applicant: SK hynix Inc., Icheon-si (KR)

(72) Inventors: Choung Ki Song, Icheon-si (KR);
Kwan Dong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 134 days.

This patent is subject to a terminal disclaimer.

(21) Appl. No.: 18/509,145

(22) Filed: Nov. 14, 2023

(65) Prior Publication Data

US 2024/0249756 A1       Jul. 25, 2024

(30) Foreign Application Priority Data

| | | |
|---|---|---|
| Jan. 19, 2023 | (KR) | 10-2023-0008373 |
| Jan. 19, 2023 | (KR) | 10-2023-0008374 |
| Jan. 19, 2023 | (KR) | 10-2023-0008376 |
| Jan. 19, 2023 | (KR) | 10-2023-0008377 |
| Jan. 19, 2023 | (KR) | 10-2023-0008382 |
| Jan. 19, 2023 | (KR) | 10-2023-0008383 |
| Jun. 30, 2023 | (KR) | 10-2023-0084932 |

(51) Int. Cl.
*H01L 23/00* (2006.01)
*G11C 7/10* (2006.01)
(Continued)

(52) U.S. Cl.
CPC ............ *G11C 7/109* (2013.01); *G11C 7/1069* (2013.01); *G11C 7/1084* (2013.01); *G11C 7/222* (2013.01); *H01L 25/0657* (2013.01); *H01L 2224/08145* (2013.01); *H01L 2224/48132* (2013.01); *H01L 2924/1434* (2013.01)

(58) Field of Classification Search
CPC ..................................................... H01L 24/08
See application file for complete search history.

(56) References Cited

U.S. PATENT DOCUMENTS

| | | |
|---|---|---|
| 5,754,764 A | 5/1998 | Davis et al. |
| 7,177,211 B2 | 2/2007 | Zimmerman |

(Continued)

FOREIGN PATENT DOCUMENTS

| DE | 102007009817 B4 | 8/2012 |
|---|---|---|

*Primary Examiner* — Hoai V Ho
(74) *Attorney, Agent, or Firm* — WILLIAM PARK AND ASSOCIATES LTD.

(57) ABSTRACT

A semiconductor package may include: a package substrate including a plurality of terminals for communication with a memory controller and a plurality of bonding pads for communication inside a package; a buffer chip located on the package substrate; a plurality of memory chips stacked on the buffer chip; and a plurality of wires connecting the plurality of bonding pads and the plurality of memory chips. The buffer chip may communicate with the memory controller through the plurality of terminals of the package substrate, and the plurality of memory chips may communicate with the buffer chip through the plurality of wires and the plurality of bonding pads of the package substrate.

8 Claims, 19 Drawing Sheets

(51) Int. Cl.
    *G11C 7/22*         (2006.01)
    *H01L 25/065*     (2023.01)

(56)           References Cited

U.S. PATENT DOCUMENTS

| | | | |
|---|---|---|---|
| 7,379,361 | B2 | 5/2008 | Co et al. |
| 7,487,428 | B2 | 2/2009 | Co et al. |
| 8,275,936 | B1 | 9/2012 | Haywood et al. |
| 8,447,908 | B2 | 5/2013 | Bruce et al. |
| 9,264,368 | B2 | 2/2016 | Swarbrick et al. |
| 10,083,728 | B2 | 9/2018 | Luo et al. |
| 10,522,209 | B2 | 12/2019 | Benedict |
| 10,713,137 | B2 | 7/2020 | Kim et al. |
| 11,599,430 | B2 | 3/2023 | Bradshaw et al. |
| 12,009,023 | B2 | 6/2024 | Wu et al. |
| 12,198,784 | B2 | 1/2025 | You et al. |
| 12,405,748 | B2 * | 9/2025 | Lee ........................ G06F 3/0656 |
| 2005/0224948 | A1 * | 10/2005 | Lee ........................ H05K 1/181 |
| | | | 257/686 |
| 2007/0201256 | A1 | 8/2007 | RaghuRam |
| 2008/0025137 | A1 | 1/2008 | Rajan et al. |
| 2009/0216939 | A1 | 8/2009 | Smith et al. |
| 2014/0181392 | A1 | 6/2014 | Malladi et al. |
| 2014/0189215 | A1 | 7/2014 | Kang et al. |
| 2014/0192583 | A1 | 7/2014 | Rajan et al. |
| 2015/0363287 | A1 | 12/2015 | Dell et al. |
| 2016/0147623 | A1 | 5/2016 | Ping et al. |
| 2017/0212848 | A1 | 7/2017 | Sun et al. |
| 2017/0277463 | A1 | 9/2017 | Yoon |
| 2018/0166105 | A1 | 6/2018 | Choi et al. |
| 2019/0171359 | A1 | 6/2019 | Lee et al. |
| 2019/0237152 | A1 | 8/2019 | Lee et al. |
| 2019/0362804 | A1 * | 11/2019 | Kim ............... G01R 31/318513 |
| 2021/0397570 | A1 * | 12/2021 | Ware .................... G11C 7/1084 |
| 2021/0407567 | A1 | 12/2021 | Kim |
| 2022/0238146 | A1 | 7/2022 | Woo et al. |
| 2023/0072674 | A1 | 3/2023 | Vogelsang et al. |
| 2023/0152840 | A1 | 5/2023 | Zhang et al. |
| 2024/0055068 | A1 | 2/2024 | Bamdhamravuri et al. |
| 2024/0094762 | A1 | 3/2024 | Zhang et al. |
| 2024/0144984 | A1 | 5/2024 | Morishita |
| 2024/0194227 | A1 | 6/2024 | Wu et al. |
| 2024/0249767 | A1 | 7/2024 | Song |
| 2024/0264947 | A1 | 8/2024 | Kim |
| 2024/0321831 | A1 | 9/2024 | Shin et al. |
| 2024/0420790 | A1 | 12/2024 | Taylor et al. |

* cited by examiner

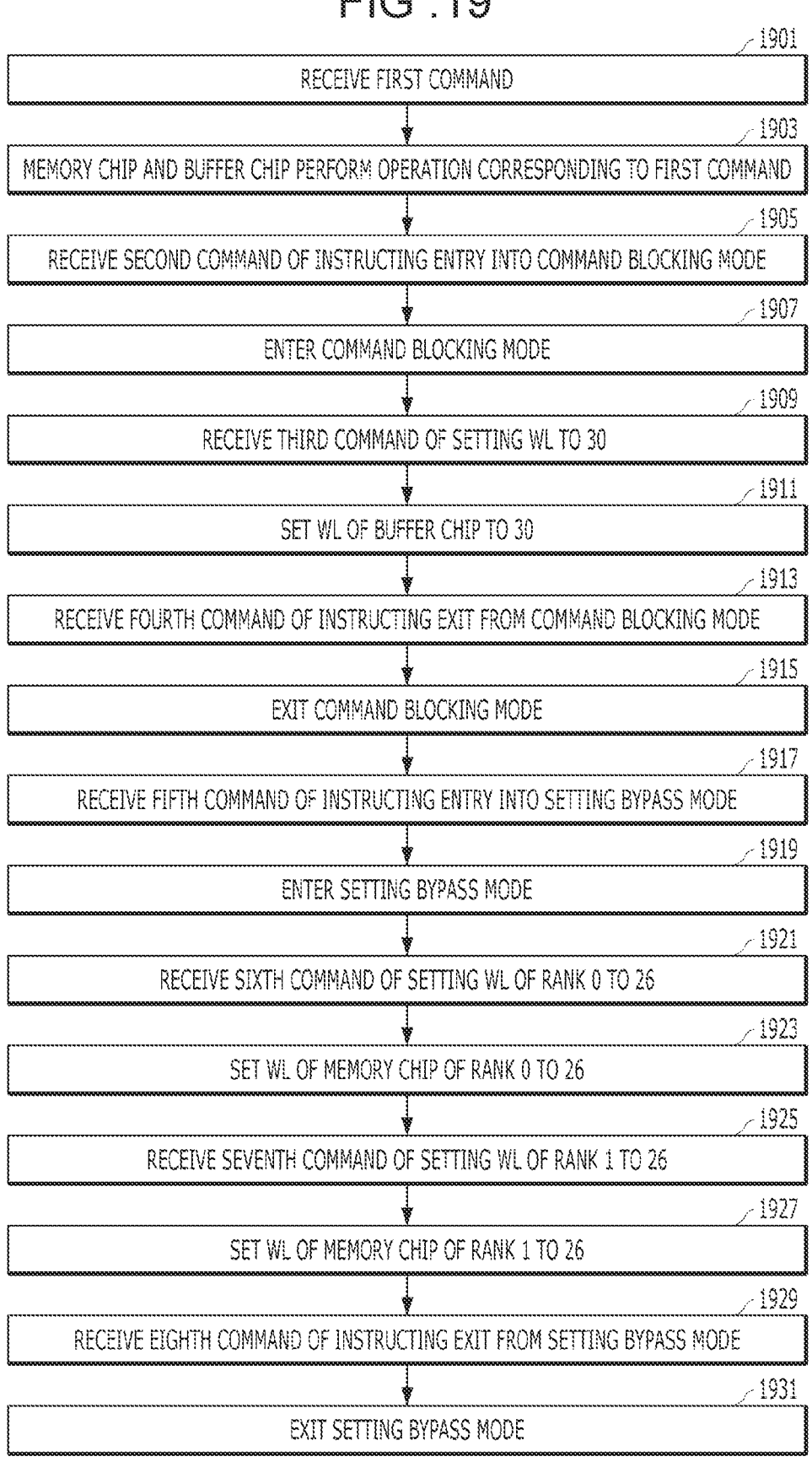

1901
RECEIVE FIRST COMMAND

1903
MEMORY CHIP AND BUFFER CHIP PERFORM OPERATION CORRESPONDING TO FIRST COMMAND

1905
RECEIVE SECOND COMMAND OF INSTRUCTING ENTRY INTO COMMAND BLOCKING MODE

1907
ENTER COMMAND BLOCKING MODE

1909
RECEIVE THIRD COMMAND OF SETTING WL TO 30

1911
SET WL OF BUFFER CHIP TO 30

1913
RECEIVE FOURTH COMMAND OF INSTRUCTING EXIT FROM COMMAND BLOCKING MODE

1915
EXIT COMMAND BLOCKING MODE

1917
RECEIVE FIFTH COMMAND OF INSTRUCTING ENTRY INTO SETTING BYPASS MODE

1919
ENTER SETTING BYPASS MODE

1921
RECEIVE SIXTH COMMAND OF SETTING WL OF RANK 0 TO 26

1923
SET WL OF MEMORY CHIP OF RANK 0 TO 26

1925
RECEIVE SEVENTH COMMAND OF SETTING WL OF RANK 1 TO 26

1927
SET WL OF MEMORY CHIP OF RANK 1 TO 26

1929
RECEIVE EIGHTH COMMAND OF INSTRUCTING EXIT FROM SETTING BYPASS MODE

1931
EXIT SETTING BYPASS MODE

BUFFER CHIP, SEMICONDUCTOR PACKAGE INCLUDING BUFFER CHIP AND MEMORY CHIP, MEMORY MODULE, AND OPERATION METHOD OF SEMICONDUCTOR PACKAGE

CROSS-REFERENCE TO RELATED APPLICATION

This application claims priority under 35 U.S.C. § 119(a) to Korean Patent Application No. 10-2023-0008373 filed on Jan. 19, 2023, Korean Patent Application No. 10-2023-0008374 filed on Jan. 19, 2023, Korean Patent Application No. 10-2023-0008376 filed on Jan. 19, 2023, Korean Patent Application No. 10-2023-0008377 filed on Jan. 19, 2023, Korean Patent Application No. 10-2023-0008382 filed on Jan. 19, 2023, Korean Patent Application No. 10-2023-0008383 filed on Jan. 19, 2023, and Korean Patent Application No. 10-2023-0084932 filed on Jun. 30, 2023, in the Korean Intellectual Property Office, which are incorporated herein by reference in its entirety.

BACKGROUND

1. Technical Field

Embodiments of the present disclosure relate to a semiconductor package including a buffer chip and a memory chip, and a memory module including the same.

2. Related Art

Artificial intelligence and "big data" have dramatically increased the amount of data that requires various types of processing. Many computer systems (for example, data centers, servers, and the like) therefore require a large amount of memory. Applications using such computer systems require larger amounts of memory. It is becoming increasingly difficult, however, to add memory to a computer system because of issues such as latency and bandwidths. Various methods for increasing the amount of a memory in a system while maintaining low latency and a high bandwidth are being studied.

SUMMARY

In an embodiment, a semiconductor package may include a package substrate having a plurality of terminals that enable external communication with a memory controller and which also has a plurality of bonding pads that enable communication inside a package. A semiconductor package may also have a buffer chip stacked on the package substrate; a plurality of memory chips stacked on the buffer chip; and wires connecting bonding pads and memory chips, wherein a buffer chip may communicate with a memory controller through the package terminals. The memory chips may communicate with the buffer chip through the wires and bonding pads of the package substrate.

In an embodiment, a memory module may include: a module controller including: a host interface configured to communicate with a host; a memory controller logic configured to provide memory control; a memory interface configured to transmit control signals and provide transmission/reception of data; a buffer chip configured to receive the control signals from the memory interface and configured to transmit and receive the data to/from the memory interface;

and a plurality of memory chips that receive the control signals through the buffer chip and transmit/receive the data through the buffer chip.

In an embodiment, a buffer chip may include: an external control signal interface, which is configured to receive control signals from a memory controller. The buffer chip may also include an external control signal interface configured to receive control signals from a memory controller; an external data interface configure to transmit data to and receive data from the memory controller; an internal control signal interface configured to transmit the control signals to a plurality of memory chips; an internal data interface configured to transmit data to and receive data from each memory chip of the plurality of memory chips; a control signal transmission circuit configured to buffer the control signals received by the external control signal interface and configured to transmit the buffered control signals to the internal control signal interface; a command decoder configured to decode the control signals received through the external control signal interface; a setting circuit configured to perform a setting operation according to a decoding result of the command decoder; and a latency control circuit configured to control whether to activate the external data interface and the internal data interface during a write operation and a read operation.

In another embodiment, a semiconductor package may include: a buffer chip configured to communicate with a memory controller; a first memory chip configured to communicate with the memory controller through the buffer chip; and a second memory chip configured to communicate with the memory controller through the buffer chip, wherein the buffer chip comprises: a command address reception circuit configured to receive command address signals transmitted from the memory controller; a first chip select signal buffer configured to receive a first chip select signal transmitted from the memory controller and corresponding to the first memory chip; a second chip select signal buffer configured to receive a second chip select signal transmitted from the memory controller and corresponding to the second memory chip; a command address transmission circuit configured to transmit the command address signals to the first memory chip and the second memory chip; a first chip select signal driver configured to transmit the first chip select signal to the first memory chip; a second chip select signal driver configured to transmit the second chip select signal to the second memory chip; a first command decoder configured to decode the first chip select signal and the command address signals; a second command decoder configured to decode the second chip select signal and the command address signals; a first setting circuit configured to set a buffering operation for the first memory chip according to a decoding result of the first command decoder; and a second setting circuit configured to set a buffering operation for the second memory chip according to a decoding result of the second command decoder.

In yet another embodiment, a buffer chip may include: a command address reception circuit configured to receive command address signals transmitted from a memory controller; a first chip select signal buffer configured to receive a first chip select signal transmitted from the memory controller and corresponding to a first memory chip; a second chip select signal buffer configure to receive a second chip select signal transmitted from the memory controller and corresponding to a second memory chip; a command address transmission circuit configured to receive the command address signals to the first memory chip and the second memory chip; a first chip select signal driver configured to transmit the first chip select signal to the first memory chip; a second chip select signal driver configured to transmit the second chip select signal to the second memory chip; a first command decoder configured to decode the first chip select signal and the command address signals; a second command decoder configured to decode the second chip select signal and the command address signals; a first setting circuit configured to set a buffering operation for the first memory chip according to a decoding result of the first command decoder; and a second setting circuit configured to set a buffering operation for the second memory chip according to a decoding result of the second command decoder.

In a method of an embodiment, a method of operating a semiconductor package that includes a buffer chip and a plurality of memory chips communicating with a memory controller through the buffer chip and may include: sequentially entering, by the plurality of memory chips, a low power mode under control of the memory controller; checking that all the plurality of memory chips enter the low power mode; entering, by the buffer chip, the low power mode in response to the check; exiting, by one of the plurality of memory chips, the low power mode under control of the memory controller; and exiting, by the buffer chip, the low power mode in response to the exit.

In another embodiment of a method, an operation method of a semiconductor package is an operation method of the semiconductor package including a buffer chip and a memory chip communicating with a memory controller through the buffer chip and may include: receiving, by the buffer chip, a setting command and a setting value from the memory controller; checking, by the buffer chip, whether a setting item of the setting command corresponds to predetermined items; generating, by the buffer chip, a memory setting value different from the setting value in response to the check, and transmitting a memory setting command for setting the setting item to the memory setting value and the memory setting value to the memory chip; and setting the memory chip according to the memory setting command and the memory setting value.

In disclosed embodiments, a buffer chip may include: an external control signal interface for receiving control signals from a memory controller; an external interface configured to receive control signals from a memory controller and configured to transmit data to and receive data from the memory controller; an internal interface configured to transmit the control signals to a plurality of memory chips and additionally configured to transmit data to and receive data from the plurality of memory chips; a control signal transmission circuit configured to buffer the control signals received by the external interface and configured to transmit the buffered control signals to the internal interface; a command decoder that decodes the control signals received through the external interface; a setting circuit configured to perform a setting operation according to a decoding result of the command decoder; a memory setting value generation circuit that, when a setting operation for predetermined items is instructed as the decoding result of the command decoder, generates memory control signals for setting a corresponding item to a setting value different from a setting value of the memory controller; and a blocking circuit that, when the setting operation for the predetermined items is instructed as the decoding result of the command decoder, allows the memory control signals to be transmitted instead of the control signals of the control signal transmission circuit.

In an embodiment, a buffer chip may include: a command address reception circuit configured to receive command address signals transmitted from a memory controller; a first chip select signal buffer configured to receive a first chip select signal transmitted from the memory controller and corresponding to a first memory chip; a second chip select signal buffer configured to receive a second chip select signal transmitted from the memory controller and corresponding to a second memory chip; a command address transmission circuit configured to receive the command address signals to the first memory chip and the second memory chip; a first chip select signal driver configured to transmit the first chip select signal to the first memory chip; a second chip select signal driver configured to transmit the second chip select signal to the second memory chip; a control signal transmission circuit configured to buffer: the command address signals, the first chip select signal, and the second chip select signal respectively received by the command address reception circuit, the first chip select signal buffer, and the second chip select signal buffer, the control signal transmission circuit being additionally configured to transmit: the buffered command address signals, the first chip select signal, and the second chip select signal to the command address transmission circuit, the first chip select signal driver, and the second chip select signal driver, respectively; a first command decoder that decodes the first chip select signal and the command address signals; a second command decoder that decodes the second chip select signal and the command address signals; a first setting circuit configured to set a buffering operation for the first memory chip according to a decoding result of the first command decoder; a second setting circuit configured to set a buffering operation for the second memory chip according to a decoding result of the second command decoder; a first memory setting value generation circuit that, when a setting operation for predetermined items is instructed as the decoding result of the first command decoder, generates a first memory chip select signal and first memory command address signals for setting a corresponding item to a first setting value different from a setting value of the memory controller; a second memory setting value generation circuit that, when the setting operation for the predetermined items is instructed as the decoding result of the second command decoder, generates a second memory chip select signal and second memory command address signals for setting a corresponding item to a second setting value different from the setting value of the memory controller; and a blocking circuit that, when the setting operation for the predetermined items is instructed as the decoding result of the first command decoder, prevents transmission of the first chip select signal by the control signal transmission circuit and transmits the first memory chip select signal and the first memory command address signals, and when the setting operation for the predetermined items is instructed as the decoding result of the second command decoder, prevents transmission of the second chip select signal by the control signal transmission circuit and transmits the second memory chip select signal and the second memory command address signals.

In an embodiment, an operation method of a semiconductor package is an operation method of the semiconductor package including a buffer chip and a memory chip communicating with a memory controller through the buffer chip and may include: receiving, by the buffer chip, a first command; transmitting, by the buffer chip, the first command to the memory chip; performing, by the buffer chip and the memory chip, an operation corresponding to the first command; receiving, by the buffer chip, a second command of instructing entry into a command blocking mode; entering, by the buffer chip, the command blocking mode; receiving, by the buffer chip, a third command; and performing, by the buffer chip, an operation corresponding to the third command.

In an embodiment, a buffer chip of a semiconductor package may include: an external control signal interface for receiving control signals from a memory controller; an internal control signal interface for transmitting the control signals to a plurality of memory chips; a control signal transmission circuit for buffering the control signals received by the external control signal interface and transmitting the buffered control signals to the internal control signal interface; a command decoder that decodes the control signals received through the external control signal interface; a setting circuit for performing a setting operation according to a decoding result of the command decoder; and a blocking circuit that prevents the transmission of the control signals by the control signal transmission circuit when a command blocking mode is set by the setting circuit.

In an embodiment, a buffer chip may include: an external control signal interface for receiving control signals from a memory controller; an internal control signal interface for transmitting the control signals to a plurality of memory chips; a control signal transmission circuit for buffering the control signals received by the external control signal interface and transmitting the buffered control signals to the internal control signal interface; a command decoder that decodes the control signals received through the external control signal interface; and a setting circuit that performs a setting operation according to a decoding result of the command decoder, and does not perform the setting operation in a setting bypass mode.

In an embodiment, an operation method of a semiconductor package is an operation method of a semiconductor package including a buffer chip and a memory chip communicating with a memory controller through the buffer chip and may include: receiving, by the buffer chip, a buffer setting command; performing, by the buffer chip, a setting operation in response to the buffer setting command; receiving, by the buffer chip, a memory setting command; transmitting, by the buffer chip, the memory setting command to the memory chip; and performing, by the memory chip, a setting operation in response to the memory setting command.

BRIEF DESCRIPTION OF THE DRAWINGS

FIG. 5 is a schematic diagram of an embodiment of a control signal transmission circuit 350 in FIG. 3.

FIG. 8 is a timing depicting operation of when memory controllers 113 and 115 differently set a write latency WL for each rank of the memory package 120.

FIG. 19 is a flowchart illustrating operations related to a command blocking mode and a setting bypass mode of the buffer chip 220 in FIG. 18.

DETAILED DESCRIPTION

As used herein, the meaning of "loading" will depend on the context in which "loading" is used. The words "load" and "loading" may refer to a device or devices, which consume or absorb electric power. "Load" and "loading" may also refer to the electrical power delivered by a source or sources of electrical energy.

The term, "memory package" refers to a physical structure or device, comprising a buffer chip and a plurality of memory chips. The term "memory chip" refers to an unpackaged semiconductor memory device, also known as an integrated circuit, which is "made" by subdividing a wafer of semiconductor material, in which several separate memory chips are formed at the same time.

The term, "chip" refers to a very small and very thin slice of silicon in which electronic circuits are formed.

As used herein, the term "line" refers to an electrical conductor, which functions as a wire, which is connected to and extending between two nodes or contacts between which electric current is sent. A "line" should not be construed as necessarily being straight, or narrow or elongated nor should a line be considered as planar because a "line" may include any conductor of any shape and may extend vertically as well as horizontally. A "line" may be narrow and elongated but it may also be curved or have other shapes as long as it is electrically conductive and extends between two nodes or contacts.

The term "interface" refers to a shared boundary that may be embodied as hardware or software or both and that provides an communication interconnection between two units or systems.

The term "buffer" refers to an intermediate data storage device, method or location, which is used to compensate for a difference in the rate of flow of data, or the time of occurrence of events, when transmitting information from one device to another. A "buffer chip" is a chip, which provides or comprises or acts as a buffer.

Various embodiments disclosed herein are directed to reducing electrical loading on a memory module controller, which may be caused by an increase in the number of memory devices, which are themselves required to increase the capacity of a memory module.

Hereafter, embodiments in accordance with the technical spirit of the present disclosure will be described with reference to the accompanying drawings.

Figure 1:
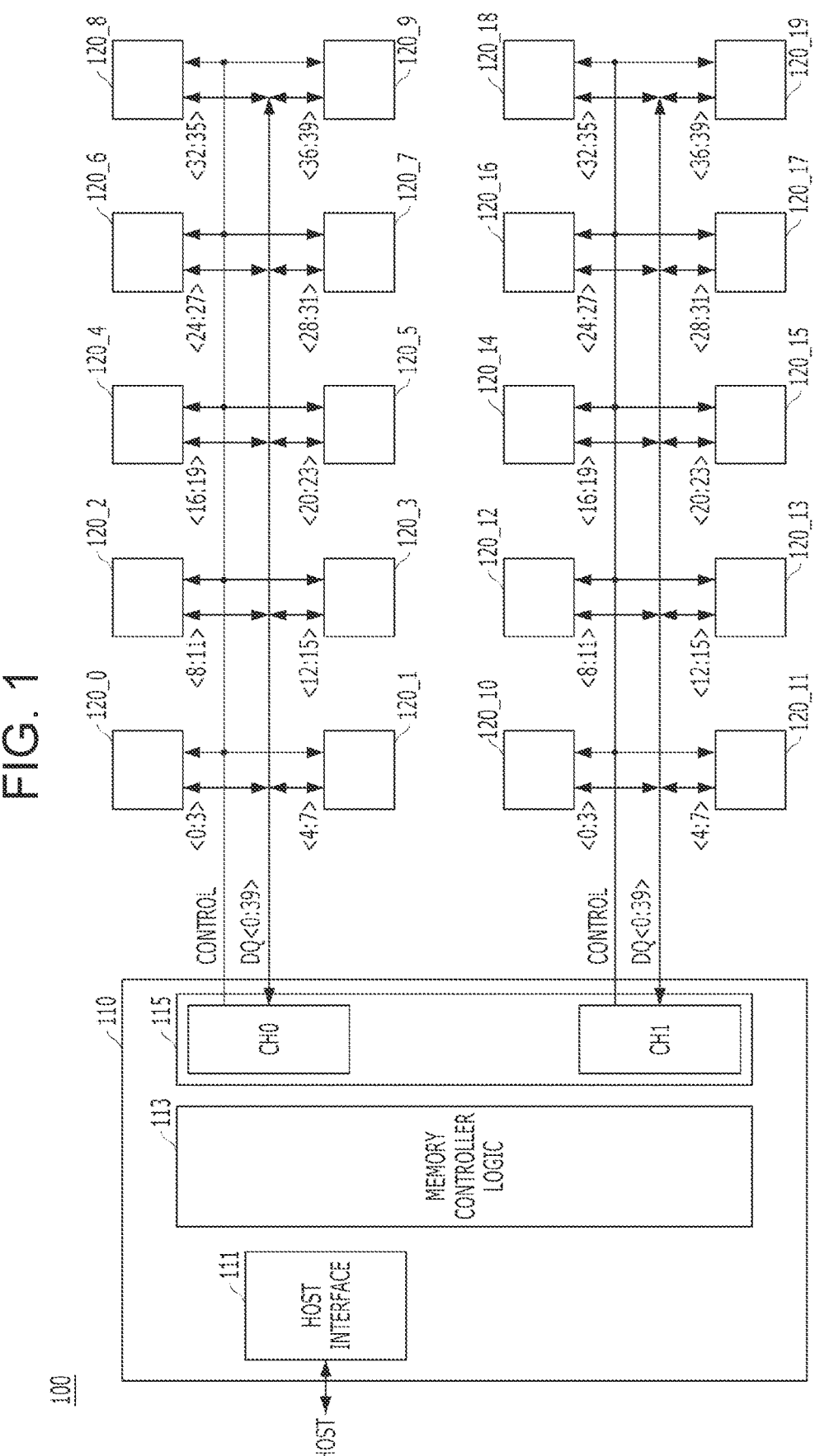
FIG. 1 is a block diagram of a memory module 100 in accordance with an embodiment.

FIG. 1 is a block diagram of a memory module 100 in accordance with an embodiment. As shown in FIG. 1, the memory module 100 may include a module controller 110 and memory packages 120_0 to 120_19.

The module controller 110 may include a host interface 111, a memory controller logic 113, and a memory interface 115. The memory controller logic 113 and the memory interface 115 are also referred to herein as a memory controller.

The host interface 111 may be used for communication between the module controller 110 and a host HOST, typically a computer or computer system.

The host interface 111 may be a compute express link (CXL) interface, which is an interface based on the peripheral component interconnect express (PCIe) bus. The CXL interface enables devices such as a central processing unit (CPU), a graphic processing unit (GPU), and various types of accelerators to use memory more efficiently. By connecting the memory module 100 to the host HOST through the CXL interface, the memory capacity of a computer system such as a data center and a server can be increased, and various processors in the computer system can share the memory.

The memory controller logic 113 may be comprised of combinational and sequential logic devices, or it may be a processor, either of which are configured to control the memory packages 120_0 to 120_19, and the memory interface 115 may be an interface for communication with the memory packages 120_0 to 120_19.

The memory interface 115 may include two communication channels denominated as CH0 and CH1. Ten memory packages 120_0 to 120_9 may be connected to the channel CH0 of the memory interface 115, and ten memory packages 120_10 to 120_19 may be connected to the channel CH1.

The channel CH0 of the memory interface 115 may be connected to the memory packages 120_0 to 120_9 through 40 data lines DQ<0:39> and through control signal transmission lines CONTROL. Four different data lines may be connected to the memory packages 120_0 to 120_9. For example, four data lines DQ<0:3> may be connected to the memory package 120_0, and four data lines DQ<4:7> may be connected to the memory package 120_1.

The control signal transmission lines CONTROL may include a plurality of lines, and may be common to the memory packages 120_0 to 120_9. For example, all of the control signal transmission lines CONTROL may be connected to the memory package 120_0 and may also be connected to the memory package 120_1. Although not illustrated in the drawing, lines for transmitting clocks and data strobe signals may be further connected between the channel CH0 of the memory interface 115 and the memory packages 120_0 to 120_9.

The channel CH1 of the memory interface 115 and the memory packages 120_10 to 120_19 may be connected in the same way as the channel CH0 and the memory packages 120_0 to 120_9.

Each of the memory packages 120_0 to 120_19 may include one or more memory chips (for example, DRAM chips). Because one of the important reasons for using the memory module 100 is to greatly increase the capacity of a memory, it is general that each of the memory packages 120_0 to 120_19 includes a plurality of memory chips. As one of methods of putting a plurality of memory chips into a memory package, a method such as 3 dimensional stacking (3DS) has been used. The 3DS method may use a through-silicon via (TSV) for communication between memory chips in a memory package. However, when a memory package is manufactured in this way, the price of the memory package may increase because a lot of time and cost are required in packaging.

In the memory module 100 in accordance with an embodiment of the present disclosure, each of the memory packages 120_0 to 120_19 may include a buffer chip and a plurality of memory chips. The buffer chip may perform a buffer operation between the module controller 110 and the plurality of memory chips. The plurality of memory chips included in each of the memory packages 120_0 to 120_19 may be connected to the buffer chip through wire bonding. The memory module 100 may increase a memory capacity by using the plurality of memory chips and reduce loading due to an increase in memory by using a buffer chip.

However, the configuration of the memory packages 120_0 to 120_19 disclosed in the present specification is merely an example and might not be limited thereto. For example, each of the memory packages 120_0 to 120_19 may include different types of memory chips. For example, at least one of the memory packages 120_0 to 120_19 may have a different configuration from other memory packages and/or may be connected to the module controller 110 in a different way. For example, memory chips included in at least one of the memory packages 120_0 to 120_19 may be integrated using a 3-dimensional stacking (3DS) method, a monolithic 3D (M3D) method, or the like. For example, memory chips included in at least one of the memory packages 120_0 to 120_19 may communicate with each other by using through-silicon vias (TSVs) or vias of different sizes and densities than TSVs.

The form factor of the memory module 100 may take various forms such as an add-in-card (AIC) and an enterprise and data center SSD form factor (EDSFF).

Figure 2:
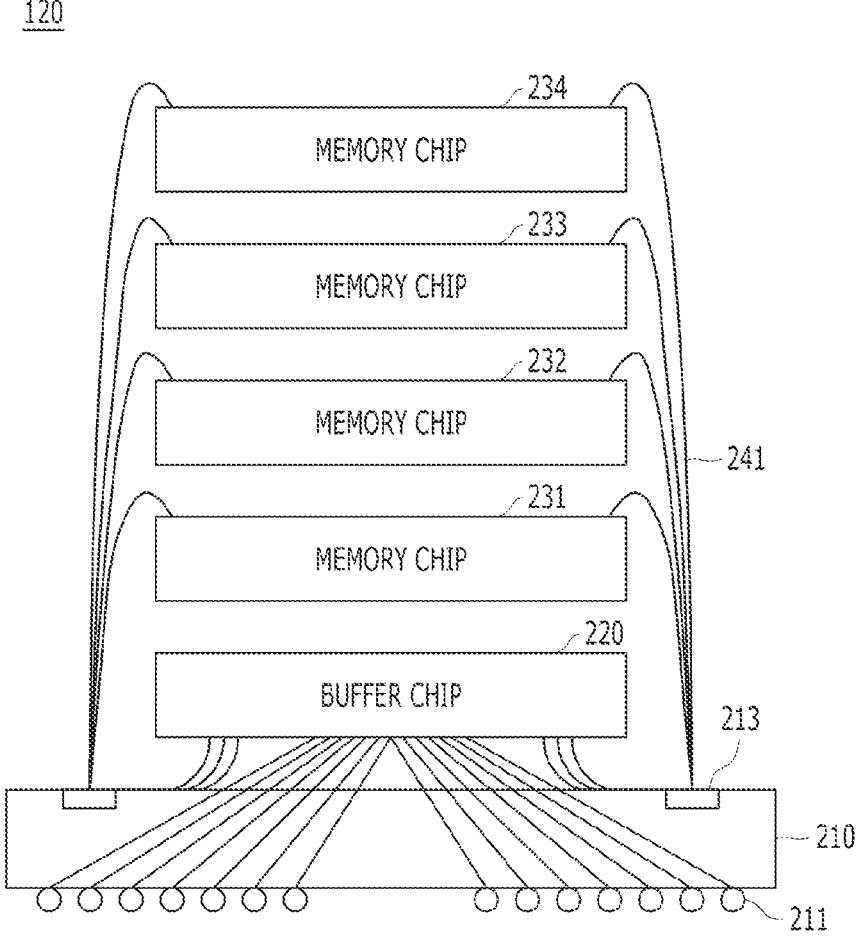
FIG. 2 is a configuration diagram of an embodiment of a memory package 120 in FIG. 1.

FIG. 2 is a configuration diagram of an embodiment of the memory package 120 in FIG. 1.

Referring to FIG. 2, the memory package 120 may include a package substrate 210, a buffer chip 220, and a plurality of memory chips 231 to 234.

The package substrate 210 may include several terminals, preferably embodied as package balls 211 located on a bottom surface of the package substrate 210. The terminals 211 enable communication between devices that comprise the memory package 120 and the memory interface 115 (FIG. 1). The package substrate 210 may also include bonding pads 213 located on the top surface of the package substrate 210, which enable signals to be exchanged between devices located inside the memory package 120, usually after the memory package 120 components are "encased."

The buffer chip 220 may be located on the package substrate 210. The buffer chip 220 may communicate with the memory interface 115 (FIG. 1) through the package balls 211 of the package substrate 210. The buffer chip 220 may further communicate with the memory chips 231 to 234 through the bonding pads 213 of the package substrate 210.

The memory chips 231 to 234 may be stacked on the buffer chip 220 and may communicate with the buffer chip 220 through wires 241 connecting the bonding pads 213 and the memory chips 231 to 234. The memory chips 231 to 234 may communicate with the memory interface 115 (FIG. 1) through the buffer chip 220. The control signals CONTROL (FIG. 1) and the data DQ<0:39> (FIG. 1) transmitted from the memory interface 115 (FIG. 1) may be transmitted to the buffer chip 220 through the package balls 211, buffered, and then transmitted from the buffer chip 220 to the memory chips 231 to 234 through the bonding pads 213. Data transmitted from the memory chips 231 to 234 may be transmitted to the buffer chip 220 through the bonding pads 213, buffered, and then transmitted to the memory interface 115 (FIG. 1) through the package balls 211.

Because only the buffer chip 220 among the chips of the memory package 120 may be connected to the memory interface 115 (FIG. 1), loading between the memory package 120 and the memory interface 115 (FIG. 1) may be reduced to enable a high-speed operation. Because the buffer chip 220 and the memory chips 231 to 234 are connected through wiring instead of a TSV that consumes a lot of cost in a manufacturing process, the manufacturing cost of the memory package 120 may be reduced.

Figure 3:
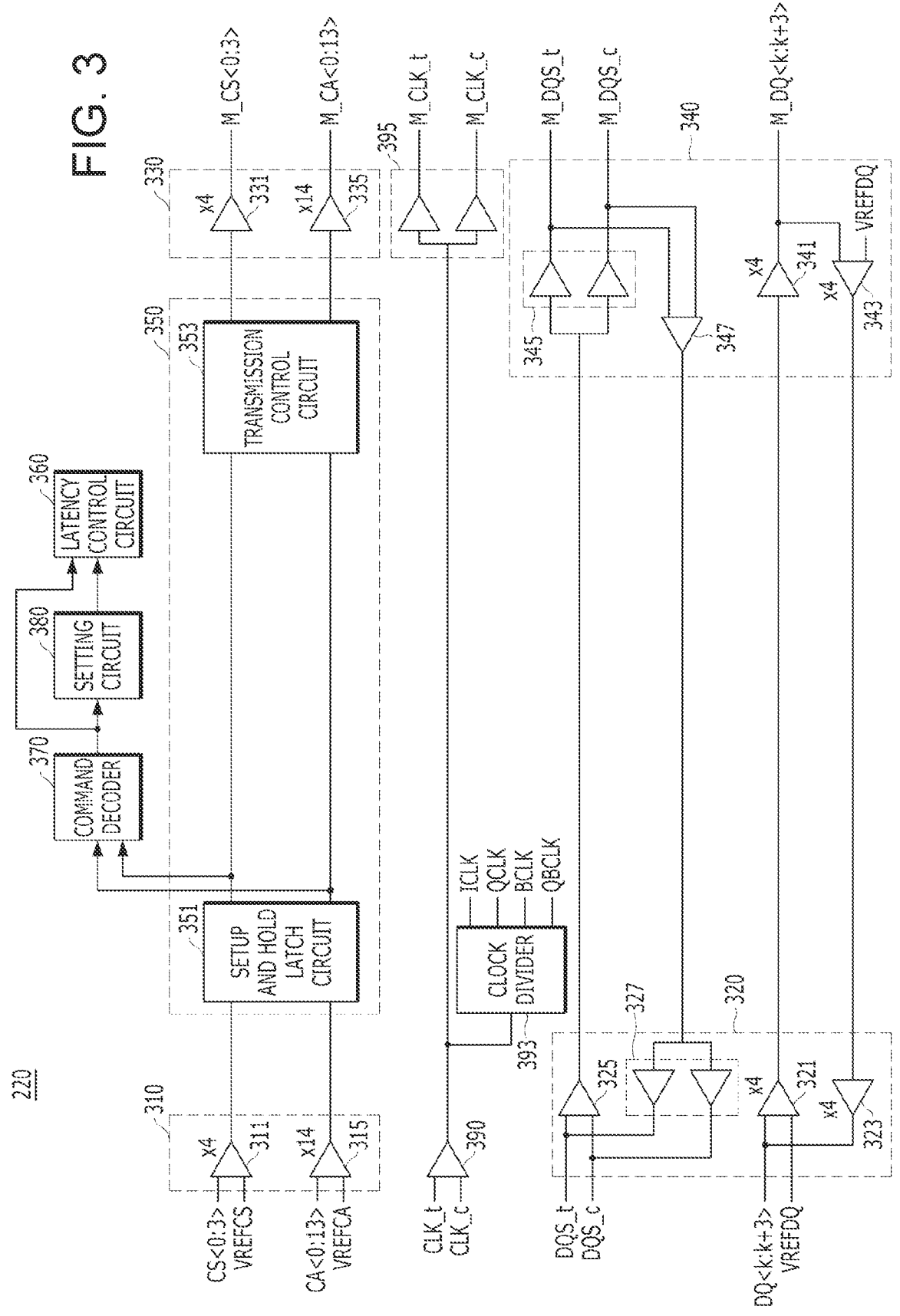
FIG. 3 is a block diagram of an embodiment of a buffer chip 220 in FIG. 2.

FIG. 3 is a block diagram of an embodiment of the buffer chip 220 in FIG. 2.

Referring to FIG. 3, the buffer chip 220 may include an external control signal interface 310, an external data interface 320, an internal control signal interface 330, an internal data interface 340, a control signal transmission circuit 350, a latency control circuit 360, a command decoder 370, a setting circuit 380, a clock reception circuit 390, a clock divider 393, and a clock transmission circuit 395.

The external control signal interface 310 may receive the control signals CONTROL (FIG. 1) transmitted from the memory interface 115 (FIG. 1). The control signals CONTROL (FIG. 1) may include chip select signals CS<0:3> and command address signals CA<0:13>. The external control signal interface 310 may include a chip select signal reception circuit 311 and a command address reception circuit 315.

The chip select signals CS<0:3> are used for distinguishing the memory chips 231 to 234 (FIG. 2) in the memory package 120 (FIG. 2), that is, for distinguishing ranks, and the number of chip select signals CS<0:3> may be the same as the number of the memory chips 231 to 234 (FIG. 2) in the memory package 120 (FIG. 2). In FIG. 3, because the number of chip select signals CS<0:3> is illustrated as 4, the chip selection reception circuit 311 may include four reception buffers. Buffers of the chip select signal reception circuit 311 may receive the chip select signals CS<0:3> by comparing voltage levels of the chip selection reference voltage VREFCS and the chip select signals CS<0:3> with each other.

The command address reception circuit 315 may include the same number of reception buffers as the number of command address signals CA<0:13>. In FIG. 3, because the number of command address signals CA<0:13> is illustrated as 14, the command address reception circuit 315 may include 14 reception buffers. Buffers of the command address reception circuit 315 may receive the command address signals CA<0:13> by comparing voltage levels of a command address reference voltage VREFCA and the command address signals CA<0:13> with each other.

The external data interface 320 may transmit/receive data DQ<k:k+3> (K is an integer equal to or greater than 0) to/from the memory interface 115 (FIG. 1). The external data interface 320 may transmit/receive not only the data DQ<k:k+3> but also data strobe signals DQS_t and DQS_c for strobing the data DQ<k:k+3>. The external data interface 320 may include an external data reception circuit 321, an external data transmission circuit 323, an external data strobe reception circuit 325, and an external data strobe transmission circuit 327.

The external data reception circuit 321 may include the same number of reception buffers as the number of terminals to which the data DQ<k:k+3> are input. Because FIG. 3 four data terminals are provided for each memory package 120 (FIG. 2), the external data reception circuit 321 may include four reception buffers. Buffers of the external data reception circuit 321 may receive the data DQ<k:k+3> by comparing voltage levels of the data reference voltage VREFDQ and the data DQ<k:k+3> with each other.

The external data strobe reception circuit 325 may receive the data strobe signals DQS_t and DQS_c transmitted from the memory interface 115 (FIG. 1), together with the data DQ<k:k+3>. Because the data strobe signals DQS_t and DQS_c are differential-type signals, the external data strobe reception circuit 325 may include a reception buffer that compares voltage levels of a positive data strobe signal DQS_t and a negative data strobe signal DQS_c with each other and receives them.

The external data transmission circuit 323 may transmit the data DQ<k:k+3>. The external data transmission circuit 323 may include four transmission drivers.

The external data strobe transmission circuit 327 may transmit the data strobe signals DQS_t and DQS_c for strobing the data DQ<k:k+3> transmitted by the external data transmission circuit 323. The external data strobe transmission circuit 327 may include two transmission drivers.

The clock reception circuit 390 may receive clocks CLK_t and CLK_c transmitted from the memory interface 115 (FIG. 1). Because the clocks CLK_t and CLK_c are differential-type signals, the clock reception circuit 390 may include a reception buffer that compares voltage levels of the regular clock CLK_t and the secondary clock CLK_c and receives them.

The clock divider 393 may divide the clocks CLK_t and CLK_c received by the clock reception circuit 390. First to fourth clocks ICLK, QCLK, BCLK, and QBCLK generated by the clock divider 393 may each have a frequency of half the frequency of each of the clocks CLK_t and CLK_c, and may have different phases. The clocks CLK_t and CLK_c received by the clock reception circuit 390 and the first to fourth clocks ICLK, QCLK, BCLK, and QBCLK generated by the clock divider 393 may be used by various components inside the buffer chip 220.

The control signal transmission circuit 350 may buffer the control signals received through the external control signal interface 310, and transmit the buffered control signals to the internal control signal interface 330. The control signal transmission circuit 350 may include a setup and hold latch circuit 351 for securing a setup hold margin and a transmission control circuit 353 performing a buffering operation.

The internal control signal interface 330 may transmit control signals M_CS<0:3> and M_CA<0:13> transmitted through the control signal transmission circuit 350 to the memory chips 231 to 234 (FIG. 2). The command address signals M_CA<0:13> may be transmitted in common to the memory chips 231 to 234 (FIG. 2), and the chip select signals M_CS<0:3> may be transmitted to the memory chips 231 to 234 (FIG. 2) in a one-to-one manner. That is, the chip select signal M_CS<0> may be transmitted to the memory chip 231 (FIG. 2), the chip select signal M_CS<1> may be transmitted to the memory chip 232 (FIG. 2), the chip select signal M_CS<2> may be transmitted to the memory chip 233 (FIG. 2), and the chip select signal M_CS<3> may be transmitted to the memory chip 234 (FIG. 2).

The internal control signal interface 330 may include a chip select signal transmission circuit 331 and a command address transmission circuit 335. Because the number of chip select signals M_CS<0:3> is 4, the chip select signal transmission circuit 331 may include four transmission drivers. Also, because the number of command address signals M_CA<0:13> is 14, the command address transmission circuit 335 may include 14 transmission drivers.

The internal data interface 340 may transmit/receive data M_DQ<k:k+3> to/from the memory chips 231 to 234 (FIG. 2). The data M_DQ<k:k+3> may be connected in common to the memory chips 231 to 234 (FIG. 2). When the data M_DQ<k:k+3> is transmitted in common to the memory chips 231 to 234 (FIG. 2) during a write operation, a memory chip selected to perform a write operation among the memory chips 231 to 234 (FIG. 2) may receive the data M_DQ<k:k+3> transmitted by the internal data interface 340. During a read operation, a memory chip selected to perform a read operation among the memory chips 231 to 234 may transmit the data M_DQ<k:k+3> to the internal data interface 340. The internal data interface 340 may transmit/receive not only the data M_DQ<k:k+3> but also the data strobe signals M_DQS_t and M_DQS_c for strobing the data M_DQ<k:k+3> to/from the memory chips 231 to 234 (FIG. 2).

The internal data interface 340 may include an internal data transmission circuit 341, an internal data reception circuit 343, an internal data strobe transmission circuit 345, and an internal data strobe reception circuit 347. The internal data transmission circuit 341 may include four transmission drivers, and the internal data reception circuit 343 may include four reception buffers. The internal data strobe transmission circuit 345 may include two transmission drivers, and the internal data strobe receive circuit 347 may include one reception buffer.

The clock transmission circuit 395 may transmit the clocks M_CLK_t and M_CLK_c to the memory chips 231 to 234 (FIG. 2). The clocks M_CLK_t and M_CLK_c may be transmitted in common to the memory chips 231 to 234 (FIG. 2). The clock transmission circuit 395 may include two transmission drivers.

The command decoder 370 may decode the chip select signals CS<0:3> and the command address signals CA<0:13> received through the external control signal interface 310. The command decoder 370 may receive and decode control signals latched by the setup and hold latch circuit 351 after being received by the external control signal interface 310. The chip select signals CS<0:3> indicate the validity of the command address signals CA<0:13>, and when even one of the four chip select signals CS<0:3> is activated to a low level, the command decoder 370 of the buffer chip 220 may determine that the command address signals CA<0:13> are valid and decode the command address signals CA<0:13>.

The setting circuit 380 may perform a setting operation according to the decoding result of the command decoder 370. Setting items of the setting circuit 380 may include a read latency of the buffer chip 220, a write latency of the buffer chip 220, levels of reference voltages used by the buffer chip 220, a termination resistance value (also referred to as Rtt) of the buffers of the buffer chip 220, a termination resistance value (also referred to as Ron) of the drivers of the buffer chip 220, an equalizing coefficient (for example, a coefficient of decision feedback equalization) of the buffer chip 220, a command rate, and the like.

The latency control circuit 360 may control whether to activate the external data interface 320 and the internal data interface 340. The latency control circuit 360 may activate the external data reception circuit 321 and the internal data transmission circuit 341 so that the data DQ<k:k+3> transmitted from the memory interface 115 (FIG. 1) to the buffer chip 220 may be received after a write latency set by the setting circuit 380 from the time point when a write command is applied to the buffer chip 220 and transmitted to the memory chips 231 to 234 (FIG. 2). The latency control circuit 360 may further activate the internal data reception circuit 343 and the external data transmission circuit 323 so that data DQ<k:k+3> buffered after being received from the memory chips 231 to 234 (FIG. 2) may be transmitted from the buffer chip 220 to the memory interface 115 (FIG. 1) after a read latency set by the setting circuit 380 from the time point when a read command is applied to the buffer chip 220. The latency control circuit 360 may activate the external data strobe reception circuit 325 and the internal data strobe transmission circuit 345 during a write operation and activate the internal data strobe reception circuit 347 and the external data strobe transmission circuit 327 during a read operation so that the data strobe signals DQS_t and DQS_c may also be transmitted and received together with the data DQ<k:k+3>. The latency control circuit 360 may receive information indicating that a read command and a write command have been applied to the buffer chip 220 from the command decoder 370, and receive information related to the read latency and the write latency from the setting circuit 380.

Figure 4:
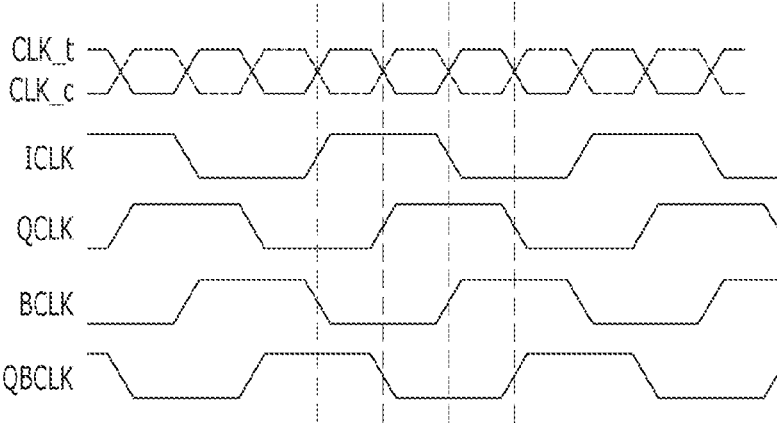
FIG. 4 is a timing diagram illustrating first to fourth clocks ICLK, QCLK, BCLK, and QBCLK generated by a clock divider 390 in FIG. 3.

FIG. 4 is a timing diagram illustrating the first to fourth clocks ICLK, QCLK, BCLK, and QBCLK generated by the clock divider 393 in FIG. 3.

Referring to FIG. 4, the first to fourth clocks ICLK, QCLK, BCLK, and QBCLK generated by the clock divider 393 may each have a frequency of half the frequency of each of the clocks CLK_t and CLK_c, and may have a phase difference of 90° among the first to fourth clocks ICLK, QCLK, BCLK, and QBCLK.

Figure 5:
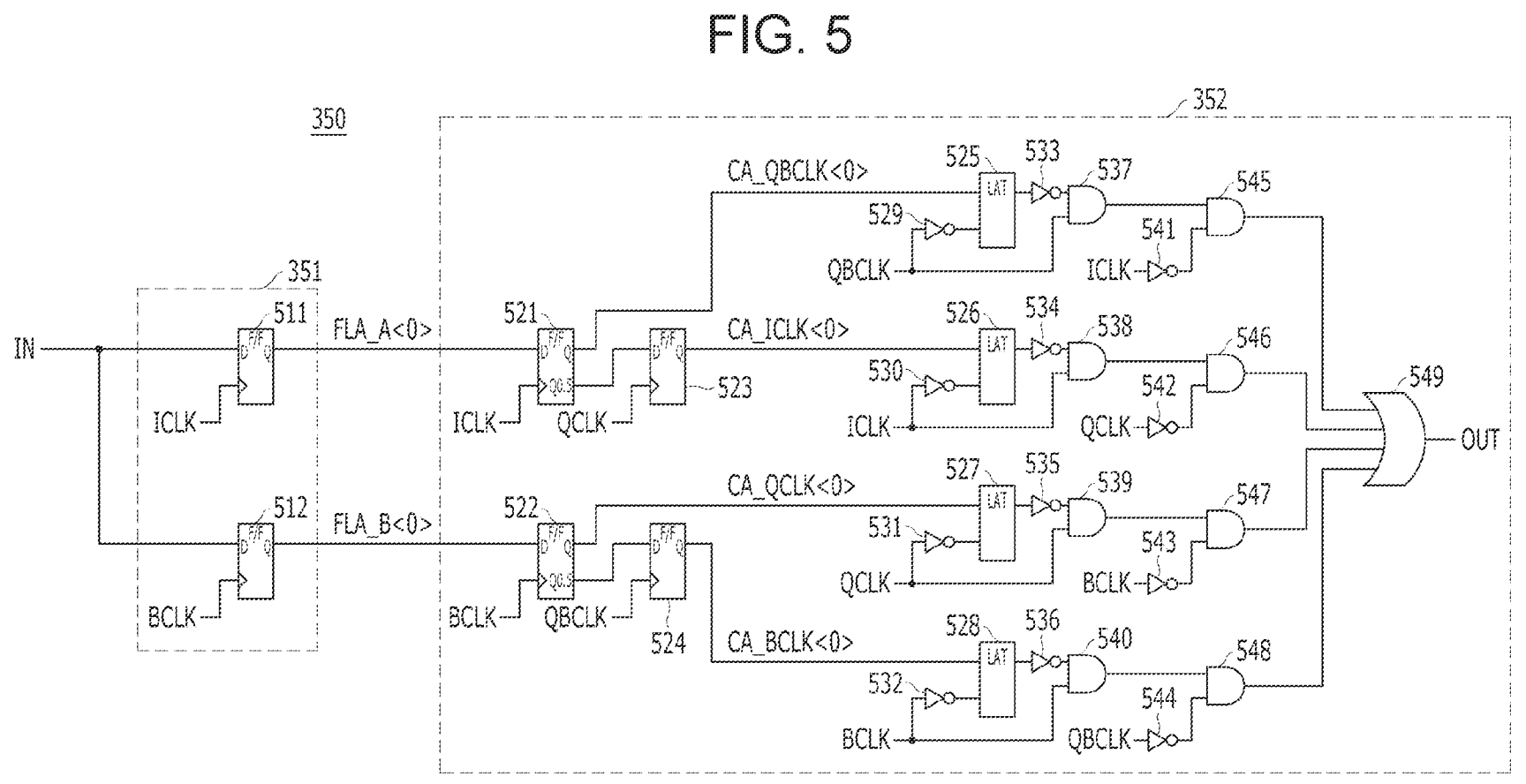
Figure 6:
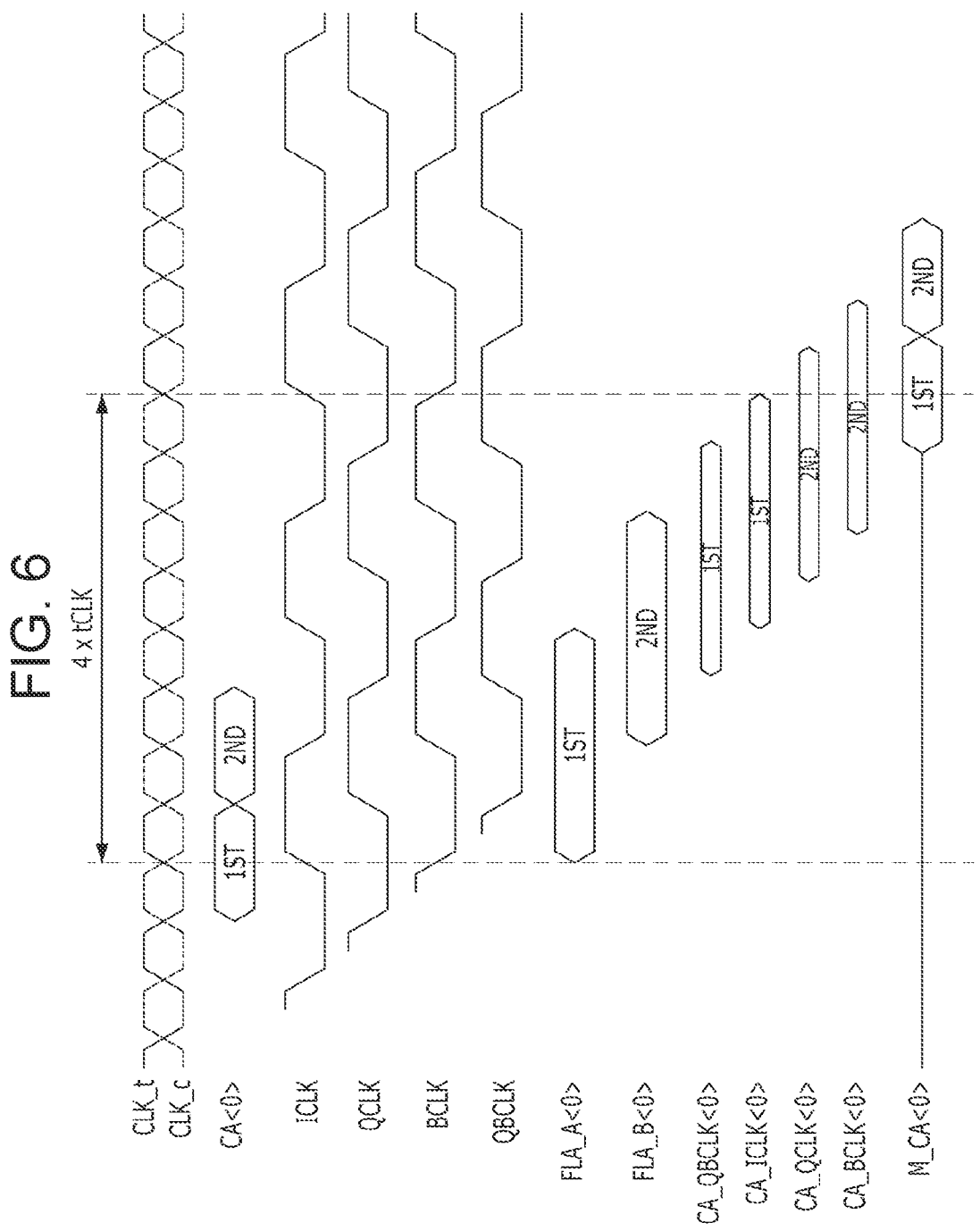
FIG. 6 is an operation timing diagram of the control signal transmission circuit 350 in FIG. 5.

FIG. 5 is a schematic diagram of an embodiment of the control signal transmission circuit 350 in FIG. 3, and FIG. 6 is an operation timing diagram of the control signal transmission circuit 350. FIG. 5 illustrates components for transmitting the command address signal CA<0> in the control signal transmission circuit 350. The remaining control signals CA<1:13> and CS<0:3> may also be transmitted in the same way as the command address signal CA<0>.

Referring to FIG. 5, the setup and hold latch circuit 351 of the control signal transmission circuit 350 may include D flip-flops 511 and 512. An input IN of the D flip-flops 511 and 512 may be an output of a buffer of the command address reception circuit 315 in FIG. 3, which receives the command address signal CA<0>. The D flip-flop 511 may receive an input at a rising edge of a first clock ICLK, latch the received input, and output a signal FLA_A<0>, and the D flip-flop 512 may receive an input at a rising edge of a third clock BCLK, latch the received input, and output a signal FLA_B<0>. Referring to FIG. 6 together, a signal 1ST of a first cycle of the command address signal CA<0> may be latched by the D flip-flop 511 and output as the signal FLA_A<0>, and a signal 2ND of a second cycle of the command address signal CA<0> may be latched by the D flip-flop 512 and output as the signal FLA_B<0>.

The transmission control circuit 352 of the control signal transmission circuit 350 may include D flip-flops 521 to 524, D latches 525 to 528, inverters 529 to 536 and 541 to 544, AND gates 537 to 540 and 545 to 548, and an OR gate 549.

Figure 7:
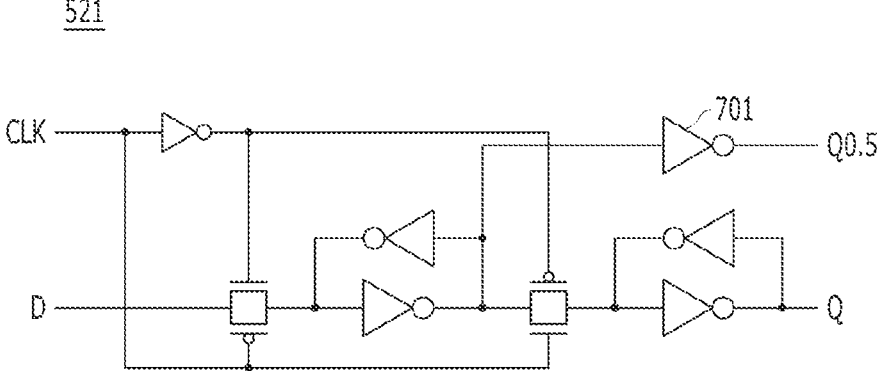
FIG. 7 is a schematic diagram illustrating an internal configuration of a D flip-flop 521.

The D flip-flop 521 may receive and latch the signal FLA_A<0> at the rising edge of the first clock ICLK. A signal output as an output Q of the D flip-flop 521 is indicated by CA_QB CLK<0>. An output Q0.5 of the D flip-flop 521 may be an output of a first stage of the D flip-flop 521 including two stages. FIG. 7 illustrates the internal configuration of the D flip-flop 521, and the D flip-flop 521 may further include an inverter 701 for outputting the output Q0.5 from a latch of the first stage in addition to the configuration of a general D flip-flop. The D flip-flop 523 may receive and latch the output Q0.5 of the D flip-flop 521 at a rising edge of the second clock QCLK, and output the latched output as a signal CA_ICLK<0>. Referring to FIG. 6, the signals CA_QBCLK<0> and CA_ICLK<0> may have a phase difference equal to a phase difference between the first clock ICLK and the second clock QCLK.

The D flip-flop 522 may receive and latch the signal FLA_B<0> at the rising edge of the third clock BCLK. A signal output as an output Q of the D flip-flop 522 is indicated by CA_QCLK<0>. The D flip-flop 524 may receive and latch an output Q0.5 of the D flip-flop 522 at a rising edge of the fourth clock QBCLK, and output the latched output as a signal CA_BCLK<0>. Referring to FIG. 6, the signals CA_QCLK<0> and CA_BCLK<0> may have a phase difference equal to a phase difference between the third clock BCLK and the fourth clock QBCLK.

The D latch 525 may latch and output the signal CA_QBCLK<0> while the fourth clock QBCLK is at a low level, an output of the D latch 525 may be inverted by the inverter 533, and an output of the inverter 533 and the fourth clock QBCLK may be input to the AND gate 537. An output of the AND gate 537 may be input to the AND gate 545 together with the first clock ICLK inverted by the inverter 541.

The D latch 526 may latch and output the signal CA_ICLK<0> while the first clock ICLK is at a low level, an output of the D latch 526 may be inverted by the inverter 534, and an output of the inverter 534 and the first clock ICLK may be input to the AND gate 538. An output of the AND gate 538 may be input to the AND gate 546 together with the second clock QCLK inverted by the inverter 542.

The D latch 527 may latch and output the signal CA_QCLK<0> while the second clock QCLK is at a low level, an output of the D latch 527 may be inverted by the inverter 535, and an output of the inverter 535 and the second clock QCLK may be input to the AND gate 539. An output of the AND gate 539 may be input to the AND gate 547 together with the third clock BCLK inverted by the inverter 543.

The D latch 528 may latch and output the signal CA_BCLK<0> while the third clock BCLK is at a low level, an output of the D latch 528 may be inverted by the inverter 536, and an output of the inverter 536 and the third clock BCLK may be input to the AND gate 540. An output of the AND gate 540 may be input to the AND gate 548 together with the fourth clock QBCLK inverted by the inverter 544.

Outputs of the AND gates 545 to 548 may be input to the OR gate 549, and an output OUT of the OR gate 549 may be an input of a driver of the command address transmission circuit 335 in FIG. 3, which transmits the command address signal M_CA<0>.

Referring to the timing diagram in FIG. 6, the command address signal CA<0> received from the memory interface 115 (FIG. 1) by the command address reception circuit 315 of the buffer chip 220 may be buffered by the control signal transmission circuit 350, delayed by 4 clock cycles based on the clocks CLK_t and CLK_c, and transmitted to the memory chips 231 to 234 (FIG. 2) by the command address transmission circuit 335.

Referring now to FIGS. 1, 2 and 3, the buffer chip 220 in FIG. 3 includes one command decoder 370 and one setting circuit 380. The command decoder 370 does not distinguish the chip select signals CS<0:3>, and determines that the command address signals CA<0:13> are valid when even one of the chip select signals CS<0:3> is activated to a low level. When the memory controllers 113 and 115 of the module controller 110 set different values for each of the memory chips 231 to 234 distinguished by the chip select signals CS<0:3> in the memory package 120, that is, for each rank, a problem may occur in the operations of the buffer chip 220 and the memory package 120.

Figure 8:
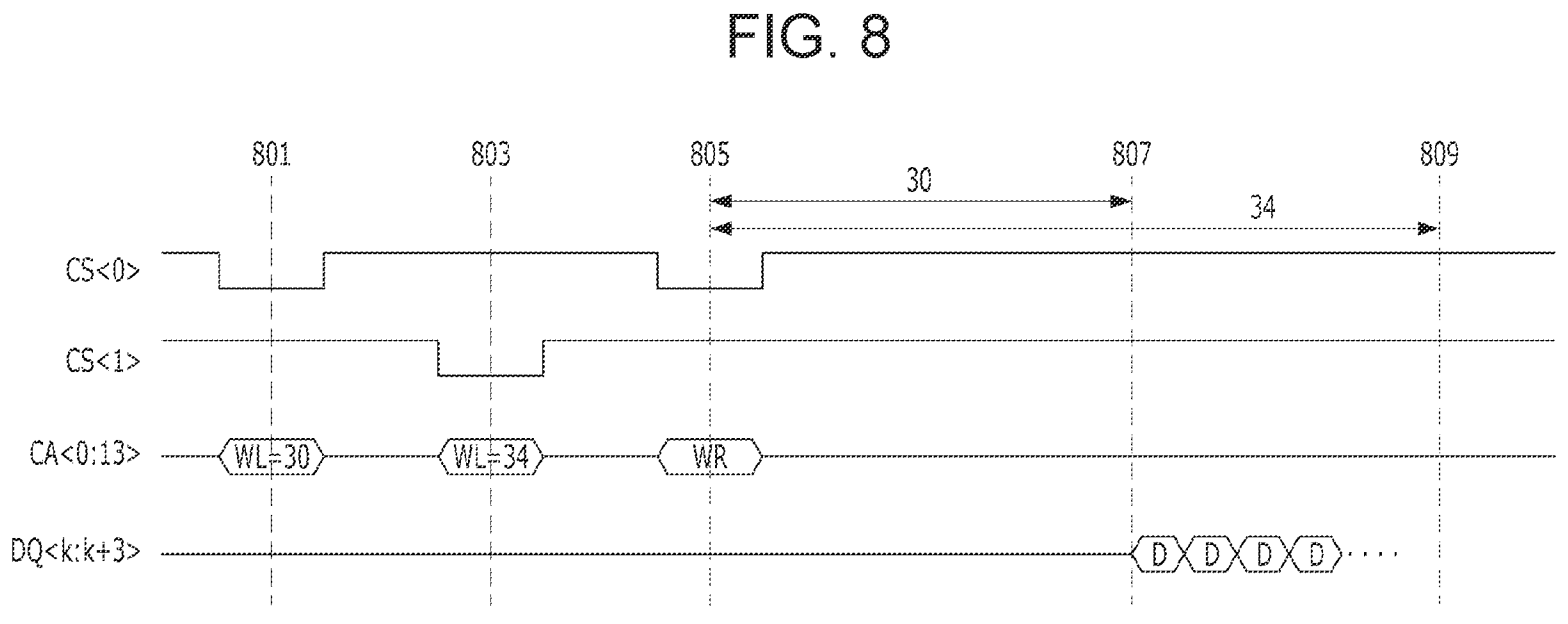

FIG. 8 is a timing diagram for explaining a problem that may arise when the memory controllers 113 and 115 set a different write latency WL for each rank of the memory package 120.

Referring to FIG. 3 and FIG. 8, when the chip select signal CS<0> is activated to a low level at a time point 801, the write latency may be set to 30 by the command address signals CA<0:13> (WL=30). Because the command decoder 370 and the setting circuit 380 of the buffer chip 220 do not distinguish the chip select signals CS<0:3>, that is, ranks, the write latency of the buffer chip 220 is set to 30.

At a time point 803, when the chip select signal CS<1> is activated to a low level, the write latency may be set to 34 by the command address signals CA<0:13> (WL=34). Because the command decoder 370 and the setting circuit 380 of the buffer chip 220 do not distinguish the chip select signals CS<0:3>, the write latency of the buffer chip 220 is changed to 34.

At a time point 805, when the chip select signal CS<0> is activated to a low level, a write operation may be commanded by the command address signals CA<0:13> (WR). Write data D may be transmitted from the memory controllers 113 and 115 (FIG. 1) to the buffer chip 220 from the time point 805 to a time point 807 corresponding to the chip select signal CS<0>, that is, a rank 0, after the write latency of 30 clocks.

However, because the write latency of the buffer chip 220 has been set to 34, the buffer chip does not activate the external data reception circuit 321, the external data strobe reception circuit 325, the external data transmission circuit 323, and the external data strobe transmission circuit 327 at the time point 807, and activates the external data reception circuit 321, the external data strobe reception circuit 325, the external data transmission circuit 323, and the external data strobe transmission circuit 327 from a time point 809. That is, the buffer chip 220 might not properly receive the data D transmitted from the memory controllers 113 and 115.

That is, when the memory controllers 113 and 115 differently set the write latency for each rank, an abnormal operation may occur because the buffer chip 220 does not differently set the write latency for each rank. Such an abnormal operation may occur equally when not only the write latency but also the read latency, the level of reference voltages, the termination resistance values of buffers, the termination resistance values of drivers, an equalizing coefficient, and the like are set differently for each rank.

Figure 9:
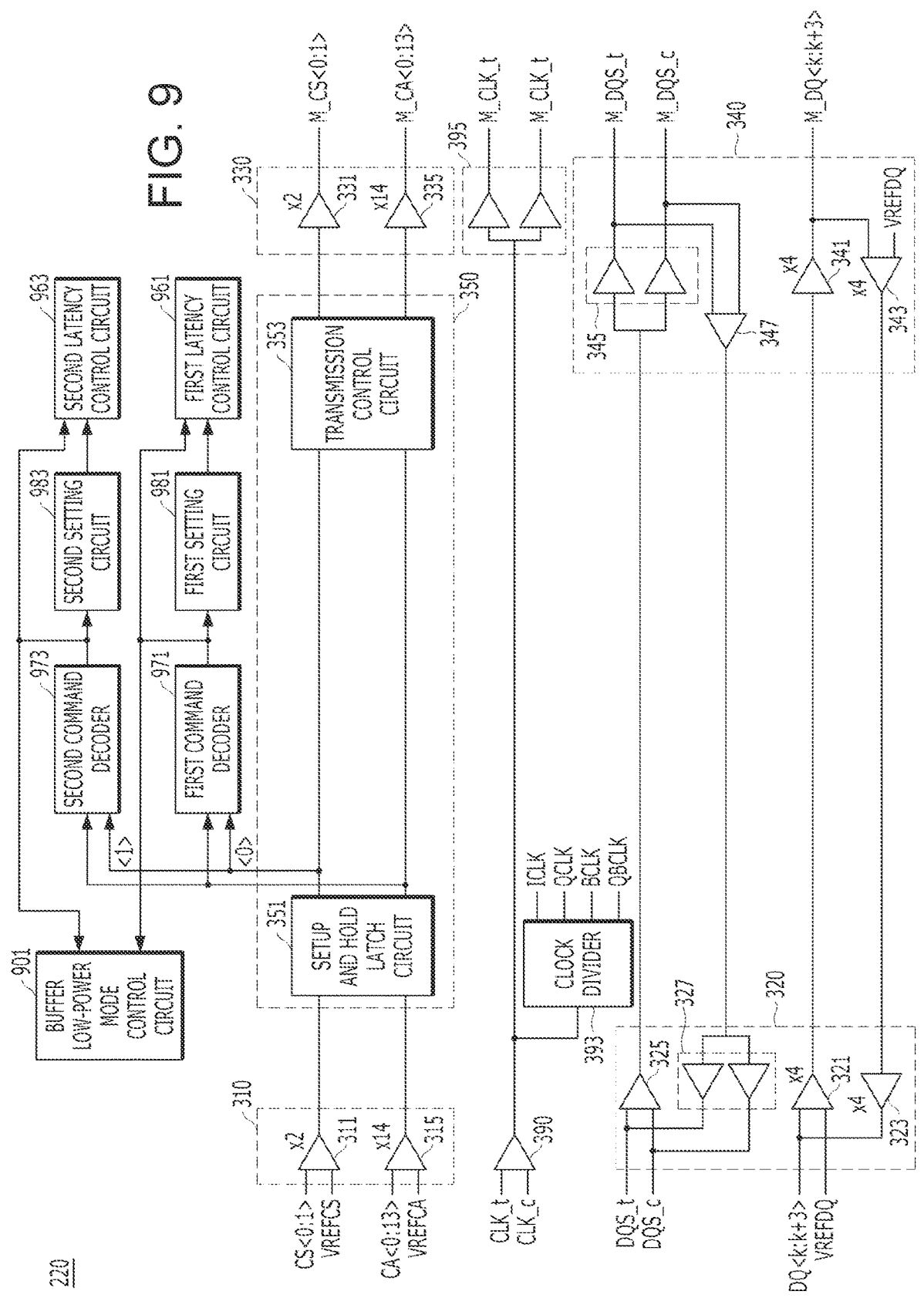
FIG. 9 is a block diagram of another embodiment of the buffer chip 220 in FIG. 2.

FIG. 9 is a block diagram of another embodiment of the buffer chip 220 in FIG. 2. In FIG. 9, an embodiment in which the buffer chip 220 can separately perform a setting operation for each rank will be described. Hereinafter, for convenience of explanation, it is assumed that the number of chip select signals CS<0:1> is 2, that is, the number of memory chips 231 and 232 (FIG. 2) included in the memory package 120 (FIG. 2) is 2, which refers to two ranks.

Referring to FIG. 9, the buffer chip 220 may include the external control signal interface 310, the external data interface 320, the internal control signal interface 330, the internal data interface 340, the control signal transmission circuit 350, a first latency control circuit 961, a second latency control circuit 963, a first command decoder 971, a second command decoder 973, a first setting circuit 981, a second setting circuit 983, the clock reception circuit 390, the clock divider 393, the clock transmission circuit 395, and a buffer low-power mode control circuit 901.

The first command decoder 971 may decode the chip select signal CS<0> and the command address signals CA<0:13> received through the external control signal interface 310. Specifically, when the chip select signal CS<0> is activated to a low level, the first command decoder 971 may decode the command address signals CA<0:13>. That is, the first command decoder 971 may decode a command of rank 0.

The second command decoder 973 may decode the chip select signal CS<1> and the command address signals CA<0:13> received through the external control signal interface 310. Specifically, when the chip select signal CS<1> is activated to a low level, the second command decoder 973 may decode the command address signals CA<0:13>. That is, the second command decoder 973 may decode a command of rank 1.

The first setting circuit 981 may perform a setting operation corresponding to rank 0, that is, the memory chip 231, according to the decoding result of the first command decoder 971. Setting items of the first setting circuit 981 may include the read latency and write latency for the buffering operation of the buffer chip 220 for the memory chip 231, levels of reference voltages used during the buffering operation of the buffer chip 220 for the memory chip 231, termination resistance values of buffers used during the buffering operation of the buffer chip 220 for the memory chip 231, termination resistance values of drivers used during the buffering operation of the buffer chip 220 for the memory chip 231, equalizing coefficients used during the buffering operation of the buffer chip 220 for the memory chip 231, and the like.

The second setting circuit 983 may perform a setting operation corresponding to rank 1, that is, the memory chip 232, according to the decoding result of the second command decoder 973. Setting items of the second setting circuit 983 may include the read latency and write latency for the buffering operation of the buffer chip 220 for the memory chip 232, levels of reference voltages used during the buffering operation of the buffer chip 220 for the memory chip 232, termination resistance values of buffers used during the buffering operation of the buffer chip 220 for the memory chip 232, termination resistance values of drivers used during the buffering operation of the buffer chip 220 for the memory chip 232, equalizing coefficients used during the buffering operation of the buffer chip 220 for the memory chip 232, and the like.

The first latency control circuit 961 may control whether to activate the external data interface 320 and the internal data interface 340. The first latency control circuit 961 may activate the external data reception circuit 321 and the internal data transmission circuit 341 so that the data DQ<k:k+3> transmitted from the memory interface 115 (FIG. 1) to the buffer chip 220 may be received after the write latency set by the first setting circuit 981 from the time point when a write command corresponding to rank 0 is applied to the buffer chip 220 and transmitted to the memory chip 231 of rank 0. The first latency control circuit 961 may further activate the internal data reception circuit 343 and the external data transmission circuit 323 so that data DQ<k:k+3> buffered after being received from the memory chip 231 may be transmitted from the buffer chip 220 to the memory interface 115 (FIG. 1) after the read latency set by the first setting circuit 981 from the time point when a read command corresponding to rank 0 is applied to the buffer chip 220. The first latency control circuit 961 may further activate the external data strobe reception circuit 325 and the internal data strobe transmission circuit 345 during the write operation of rank 0 and activate the internal data strobe reception circuit 347 and the external data strobe transmission circuit 327 during the read operation of rank 0 so that the data strobe signals DQS_t and DQS_c may also be transmitted and received together with the data DQ<k:k+3>. The first latency control circuit 961 may receive, from the first command decoder 971, information indicating that the read command and the write command of rank 0 have been applied to the buffer chip 220, and receive information related to the read latency and the write latency of rank 0 from the first setting circuit 981.

The second latency control circuit 963 may control whether to activate the external data interface 320 and the internal data interface 340. The second latency control circuit 963 may activate the external data reception circuit 321 and the internal data transmission circuit 341 so that the data DQ<k:k+3> transmitted from the memory interface 115 (FIG. 1) to the buffer chip 220 may be received after the write latency set by the second setting circuit 983 from the time point when the write command corresponding to rank 1 is applied to the buffer chip 220 and transmitted to the memory chip 232 of rank 1. The second latency control circuit 963 may further activate the internal data reception circuit 343 and the external data transmission circuit 323 so that data DQ<k:k+3> buffered after being received from the memory chip 232 may be transmitted from the buffer chip 220 to the memory interface 115 (FIG. 1) after the read latency set by the second setting circuit 983 from the time point when the read command corresponding to rank 1 is applied to the buffer chip 220. The second latency control circuit 963 may further activate the external data strobe reception circuit 325 and the internal data strobe transmission circuit 345 during the write operation of rank 1 and activate the internal data strobe reception circuit 347 and the external data strobe transmission circuit 327 during the read operation of rank 1 so that the data strobe signals DQS_t and DQS_c may also be transmitted and received together with the data DQ<k:k+3>. The second latency control circuit 963 may receive, from the second command decoder 973, information indicating that the read command and the write command of rank 1 have been applied to the buffer chip 220, and receive information related to the read latency and the write latency of rank 1 from the second setting circuit 983.

The buffer low-power mode control circuit 901 may control the buffer chip 220 to enter and exit low power modes such as a self-refresh mode and a power-down mode. The buffer low-power mode control circuit 901 will be described in more detail together with FIG. 10.

When the buffer chip 220 performs a buffering operation for the memory chip 231 of rank 0, the buffer chip 220 may be set according to a setting value of the first setting circuit 981. When the buffer chip 220 performs a buffering operation for the memory chip 232 of rank 1, the buffer chip 220 may be set according to a setting value of the second setting circuit 983. Accordingly, even when the setting value is different for each rank, the buffer chip 220 may operate correctly.

The first latency control circuit 961 may control whether to activate the external data interface 320 and the internal data interface 340 according to the latency setting value of the first setting circuit 981 during the read and write operations of rank 0. The second latency control circuit 963 may further control whether to activate the external data interface 320 and the internal data interface 340 according to the latency setting value of the second setting circuit 983 during the read and write operations of rank 1. Accordingly, even when the read latency and the write latency of rank 0 and rank 1 are different, the buffer chip 220 may buffer read data and write data of rank 0 and rank 1.

Figure 10:
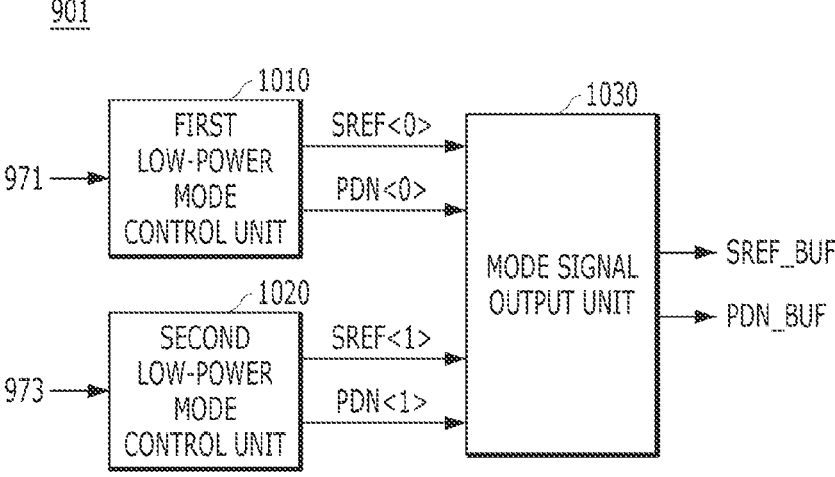
FIG. 10 is a block diagram of an embodiment of a buffer low-power mode control circuit 901 in FIG. 9.

FIG. 10 is a block diagram of an embodiment of the buffer low-power mode control circuit 901 in FIG. 9.

Referring to FIG. 10, the buffer low-power mode control circuit 901 may include a first low-power mode control unit 1010, a second low-power mode control unit 1020, and a mode signal output unit 1030.

The first low-power mode control unit 1010 may generate a first self-refresh signal SREF<0> and a first power-down mode signal PDN<0> by using the decoding result of the first command decoder 971. The first self-refresh signal SREF<0> may be a signal that is activated when rank 0, that is, the memory chip 231, enters the self-refresh mode, and is deactivated when rank 0 exits the self-refresh mode. The first power-down mode signal PDN<0> may be a signal that is activated when rank 0 enters the power-down mode and is deactivated when rank 0 exits the power-down mode.

The second low-power mode control unit 1020 may generate a second self-refresh signal SREF<1> and a second power-down mode signal PDN<1> by using the decoding result of the second command decoder 973. The second self-refresh signal SREF<1> may be a signal that is activated when rank 1, that is, the memory chip 232, enters the self-refresh mode, and is deactivated when rank 1 exits the self-refresh mode. The second power-down mode signal PDN<1> may be a signal that is activated when rank 1 enters the power-down mode and deactivated when rank 1 exits the power-down mode.

The mode signal output unit 1030 may generate a buffer self-refresh mode signal SREF_BUF for controlling the buffer chip 220 (FIG. 9) to the self-refresh mode and a buffer power-down mode signal (PDN_BUF) for controlling the buffer chip 220 (FIG. 9) to the power-down mode. The mode signal output unit 1030 may activate the buffer self-refresh mode signal SREF_BUF when both the first self-refresh signal SREF<0> and the second self-refresh signal SREF<1> are activated. That is, when all ranks enter the self-refresh mode, the buffer chip 220 (FIG. 9) may enter the self-refresh mode. When both the first power-down mode signal PDN<0> and the second power-down mode signal PDN<1> are activated, the mode signal output unit 1030 may activate the buffer power-down mode signal PDN_ BUF. That is, when all the ranks enter the power-down mode, the buffer chip 220 (FIG. 9) may enter the power-down mode.

Referring to FIG. 9 together, when the buffer self-refresh mode signal SREF_BUF is activated, the buffer chip 220 may enter the self-refresh mode. Because memory cells do not exist in the buffer chip 220, the buffer chip 220 does not perform a refresh operation in the self-refresh mode, but may perform an operation for reducing power consumption. In the self-refresh mode of the buffer chip 220, the buffer chip 220 may deactivate a portion of the external control signal interface 310 for receiving control signals not related to exiting the self-refresh mode. In exiting the self-refresh mode, the chip select signals CS<0:1> may be involved, and the command address signals CA<0:13> might not be involved. Accordingly, in the self-refresh mode of the buffer chip 220, the command address reception circuit 315 may be deactivated, thereby reducing current consumption of the buffer chip 220. This is because other commands are not applied to the buffer chip 220 before exiting the self-refresh mode.

When the buffer power-down mode signal PDN_BUF is activated, the buffer chip 220 may enter the power-down mode. In the power-down mode, the buffer chip 220 may deactivate a portion of the external control signal interface 310 for receiving control signals not related to exiting the power-down mode. In exiting the power-down mode, the chip select signals CS<0:1> may be involved, and the command address signals CA<0:13> might not be involved. Accordingly, in the power-down mode of the buffer chip 220, the command address reception circuit 315 may be deactivated, thereby reducing current consumption of the buffer chip 220. This is because commands other than a control signal instructing exit from the power-down mode are not applied during the power-down mode.

Figure 11:
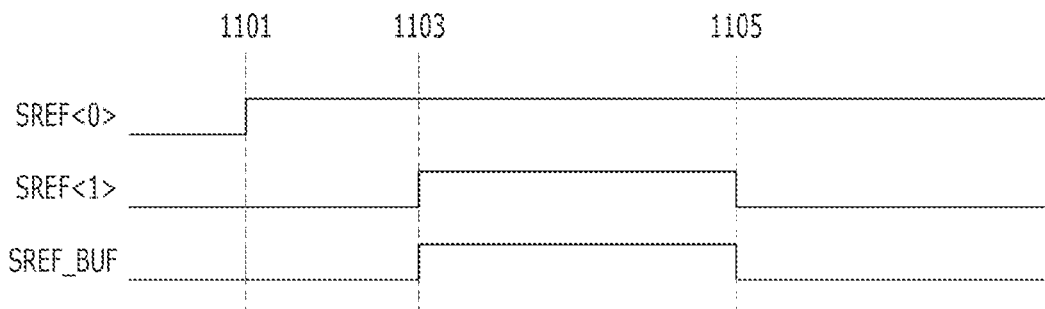
FIG. 11 is a timing diagram for explaining entering and exiting a self-refresh mode of the buffer chip 220 in FIG. 9.

FIG. 11 is a timing diagram for explaining entering and exiting the self-refresh mode of the buffer chip 220 in FIG. 9.

Referring to FIG. 11, the memory chip 231 of rank 0 may enter the self-refresh mode at a time point 1101. The first self-refresh signal SREF<0> is a signal notifying that the memory chip 231 has entered the self-refresh mode, and may be activated at the time point 1101.

At a time point 1103, the memory chip 232 of rank 1 may enter the self-refresh mode. The second self-refresh signal SREF<1> is a signal indicating that the memory chip 232 has entered the self-refresh mode, and may be activated at the time point 1103.

At the time point 1103, because both the first self-refresh signal SREF<0> and the second self-refresh signal SREF<1> are activated, the buffer self-refresh mode signal SREF_BUF is activated, so that the buffer chip 220 may enter the self-refresh mode in response to the activated buffer self-refresh mode signal SREF_BUF. The buffer chip 220 may reduce current consumption by deactivating the command address reception circuit 315 in the self-refresh mode.

At a time point 1105, the memory chip 232 of rank 1 may exit the self-refresh mode. Subsequently, the second self-refresh signal SREF<1> may be deactivated. As the second self-refresh signal SREF<1> is deactivated, the buffer self-refresh mode signal SREF_BUF may also be deactivated, and the buffer chip 220 may also exit the self-refresh mode.

That is, the buffer chip 220 may enter the self-refresh mode when the memory chips 231 and 232 of all the ranks enter the self-refresh mode, and exit the self-refresh mode when even one of the memory chips 231 and 232 exits the self-refresh mode.

Figure 12:
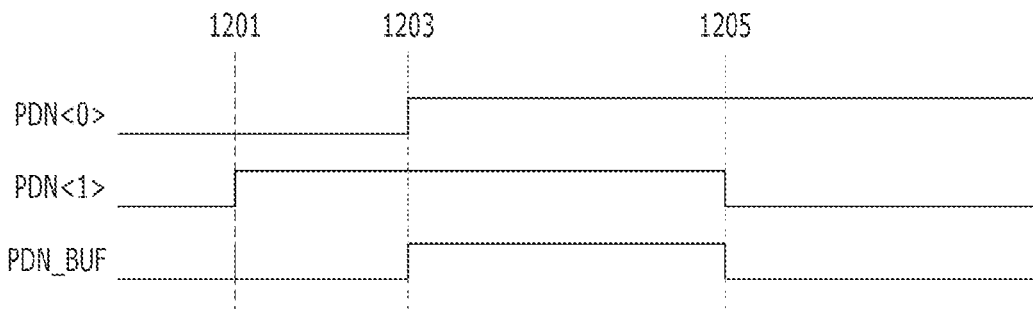
FIG. 12 is a timing diagram for explaining entering and exiting a power-down mode of the buffer chip 220 in FIG. 9.

FIG. 12 is a timing diagram for explaining entering and exiting the power-down mode of the buffer chip 220 in FIG. 9.

Referring to FIG. 12, the memory chip 232 of rank 1 may enter the power-down mode at a time point 1201 and the memory chip 231 of rank 0 may enter the power-down mode at a time point 1203.

Because all the memory chips 231 and 232 enter the power-down mode at the time point 1203, the buffer power-down mode signal PDN_BUF may be activated at the time point 1203, and the buffer chip 220 may also enter the power-down mode to reduce current consumption.

When the memory chip 232 of rank 1 exits the power-down mode at a time point 1205, the buffer chip 220 may also exit the power-down mode.

That is, the buffer chip 220 may enter the power-down mode when the memory chips 231 and 232 of all the ranks enter the power-down mode, and exit the power-down mode when even one of the memory chips 231 and 232 exits the power-down mode.

Referring now back to the example of the memory module 100 illustrated in FIG. 1, the memory package 120 illustrated in FIG. 2, and the buffer chip 220 illustrated in FIG. 9, the buffer chip 220 buffers the chip select signals CS<0:1> and the command address signals CA<0:13> transmitted from the memory interface 115 and transmits the buffered signals to the memory chips 231 and 232. Accordingly, not only the buffer chip 220 but also the memory chips 231 and 232 may be set according to setting values transmitted from the memory interface 115. The buffer chip 220 directly communicates with the memory interface 115, and the memory chips 231 and 232 communicate only with the buffer chip 220 and do not directly communicate with the memory interface 115. Therefore, the buffer chip 220 needs to be set to values suitable for communication with the memory interface 115, but the memory chips 231 and 232 do not need to be set to values suitable for communication with the memory interface 115. Instead, the memory chips 231 and 232 need to be set to values suitable for communication with the buffer chip 220. For example, the external control signal interface 310 for receiving the chip select signals CS<0:1> and the command address signals CA<0:13> in the buffer chip 220 needs to be set to values suitable for communication with the memory interface 115, but circuits inside the memory chips 231 and 23 for receiving the chip select signals M_CS<0:1> and the command address signals M_CA<0:13> transmitted from the buffer chip 220 need to be set to values suitable for communication with the buffer chip 220, instead of values suitable for communication with the memory interface 115.

Figure 13:
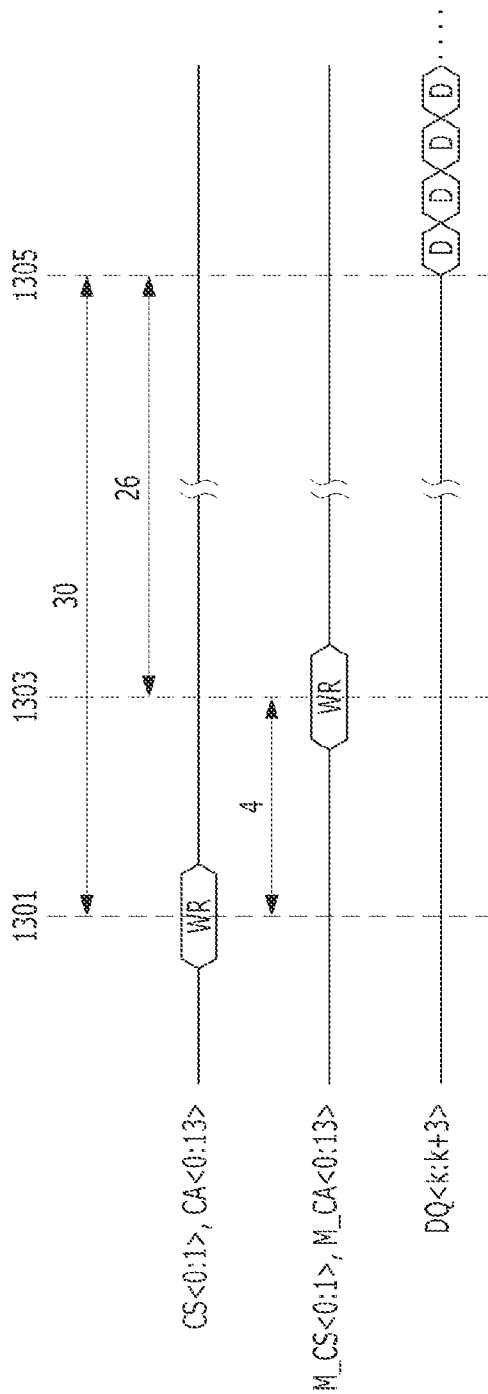
FIG. 13 and FIG. 14 are timing diagrams for explaining a problem when the latency of the buffer chip 220 and the latency of memory chips 231 and 232 are identically set.
Figure 14:
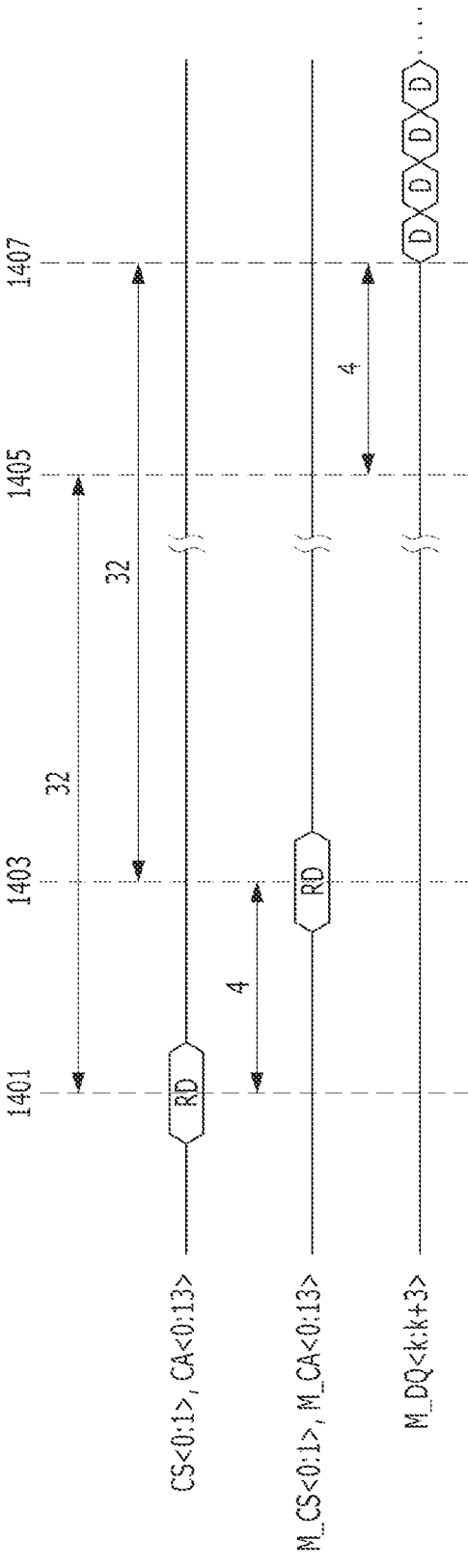

The latency of the memory chips 231 and 232 also needs to be set differently from that of the buffer chip 220. FIG. 13 and FIG. 14 are diagrams for explaining a problem when the latency of the buffer chip 220 and the latency of the memory chips 231 and 232 are identically set. Hereinafter, it is assumed that the write latency WL of the buffer chip 220 and the memory chips 231 and 232 is set to 30, and the read latency RL of the buffer chip 220 and the memory chips 231 and 232 is set to 32.

Referring to the timing diagram in FIG. 13, a write command WR may be applied from the memory interface 115 to the buffer chip 220 by the chip select signals CS<0:1> and the command address signals CA<0:13> at a time point 1301. The write command WR may be transmitted from the buffer chip 220 to the memory chips 231 and 232 at a time point 1303 delayed by four clocks from the time point 1301 through the external control signal interface 310, the control signal transmission circuit 350, and the internal control signal interface 330 of the buffer chip 220. The difference between the four clocks may be caused by the buffering operation of the control signal transmission circuit 350.

Data D may be transmitted from the memory interface 115 to the buffer chip 220 at a time point 1305 when 30 clocks corresponding to the write latency WL have passed from the time point 1301. The buffer chip 220 may correctly receive the data D because the data D is transmitted after a time equal to the write latency (WL=30) has passed from the time point 1301 at which the write command WR is received. However, the memory chips 231 and 232 might not correctly receive the data D because the data D is transmitted through the buffer chip 220 at a time point when 26 clocks, less than the write latency (WL=30), have passed from the time point 1301 at which the memory chips 231 and 232 receive the write command WR.

This is because the chip select signals CS<0:1> and the command address signals CA<0:13> are buffered and delayed by the control signal transmission circuit 350 of the buffer chip 220 and transmitted to the memory chips 231 and 232, but the data D is directly transmitted from the buffer chip 220 to the memory chips 231 and 232 with almost no delay. That is, there is a time difference of four clocks between CS<0:1>/CA<0:13> and M_CS<0:1>/M_CA<0: 13> in FIG. 9, but there may be almost no time difference between DQ<k:k+3> and M_DQ<k:k+3>.

In order to prevent the problem illustrated in FIG. 13, the write latency of the memory chips 231 and 232 needs to be set smaller than the write latency of the buffer chip 220 by 4 that is a delay value of the control signal transmission circuit 350.

Referring to the timing diagram in FIG. 14, at a time point 1401, a read command RD may be applied from the memory interface 115 to the buffer chip 220 by the chip select signals CS<0:1> and the command address signals CA<0:13>. The read command RD may be transmitted from the buffer chip 220 to the memory chips 231 and 232 at a time point 1403 delayed by four clocks from the time point 1401 through the external control signal interface 310, the control signal transmission circuit 350, and the internal control signal interface 330 of the buffer chip 220.

A memory chip selected from the memory chips 231 and 232 in order to perform a read operation may transmit the data D to the buffer chip 220 at a time point 1407 after a read latency (RL=32) has passed from the time point 1403. However, the buffer chip 220 prepares for transmitting the data D at the time point 1405 when the read latency (RL=32) has passed from the time point 1401, and the memory interface 115 also prepares for receiving the data D from the time point 1405. Accordingly, the data D might not be correctly transmitted among the memory chips 231 and 232, the buffer chip 220, and the memory interface 115.

This is a problem that occurs because the reference time point of the read operation is '1401' for the memory interface 115 and the buffer chip 220, but the reference time point of the read operation is '1403' for the memory chips 231 and 232. In order to solve such a problem, the read latency of the memory chips 231 and 232 needs to be set smaller than the read latency of the buffer chip 220 by 4 that is a delay value of the control signal transmission circuit 350.

Figure 15:
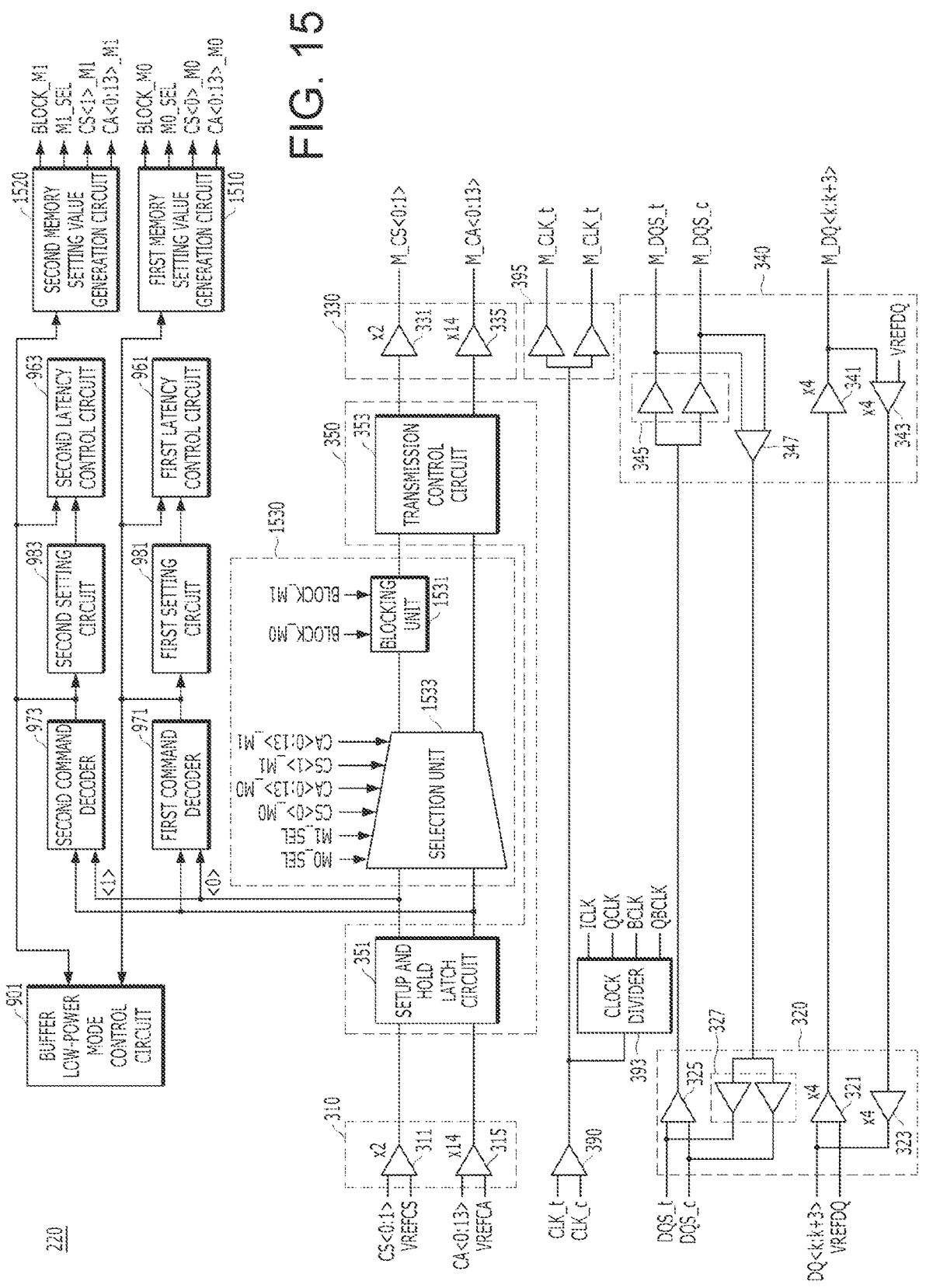
FIG. 15 is a block diagram of another embodiment of the buffer chip 220 in FIG. 2.

FIG. 15 is a block diagram of another embodiment of the buffer chip 220 in FIG. 2. In FIG. 15, an embodiment in which the buffer chip 220 and the memory chips 231 and 232 can be set to different setting values will be described.

Referring to FIG. 15, the buffer chip 220 may include the external control signal interface 310, the external data interface 320, the internal control signal interface 330, the internal data interface 340, the control signal transmission circuit 350, a first latency control circuit 961, a second latency control circuit 963, a first command decoder 971, a second command decoder 973, a first setting circuit 981, a second setting circuit 983, the clock reception circuit 390, the clock divider 393, the clock transmission circuit 395, a buffer low-power mode control circuit 901, a first memory setting value generation circuit 1510, a second memory setting value generation circuit 1520, and a blocking circuit 1530.

When a setting operation for predetermined items is instructed as a decoding result of the first command decoder 971, the first memory setting value generation circuit 1510 may generate a first memory chip select signal CS<0>_M0 and first memory command address signals CA<0:13>_M0 for setting a corresponding item to a setting value different from setting values of the memory controllers 113 and 115. The predetermined item may mean an item for which the memory chip 231 needs to be set to a setting value different from that of the buffer chip 220. For example, some of setting items used in the memory chip 231 such as a level of a reference voltage, a resistance value of a driver, a termination resistance value of a buffer, a read latency RL, a write latency WL may correspond to the predetermined items. The first memory command address signals CA<0:13>_M0 may include a memory setting command and a memory setting value for setting of the memory chip 231. A first blocking signal BLOCK_M0 may be a signal that is activated when the setting operation for the predetermined items is instructed and prevents the chip select signal CS<0> and the command address signals CA<0:13> transmitted from the memory controllers 113 and 115 from being transmitted to the memory chip 231. A first memory setting selection signal M0_SEL may be a signal that allows the first memory chip select signal CS<0>_M0 and the first memory command address signals CA<0:13>_M0 generated by the first memory setting value generation circuit 1510 to be transmitted to the memory chip 231, instead of the chip select signal CS<0> and the command address signals CA<0:13> transmitted by the memory controllers 113 and 115.

When the setting operation for the predetermined items is instructed as a decoding result of the second command decoder 973, the second memory setting value generation circuit 1520 may generate a second memory chip select signal CS<1>_M1 and second memory command address signals CA<0:13>_M1 for setting a corresponding item to a setting value different from the setting values of the memory controllers 113 and 115. The second memory command address signals CA<0:13>_M1 may include a memory setting command and a memory setting value for setting of the memory chip 232. A second blocking signal BLOCK_M1 may be a signal that is activated when the setting operation for the predetermined items is instructed and prevents the chip select signal CS<1> and the command address signals CA<0:13> transmitted from the memory controllers 113 and 115 from being transmitted to the memory chip 232. A second memory setting selection signal M1_SEL may be a signal that allows the second memory chip select signal CS<1>_M1 and the second memory command address signals CA<0:13>_M1 generated by the second memory setting value generation circuit 1520 to be transmitted to the memory chip 232, instead of the chip select signal CS<1> and the command address signals CA<0:13> transmitted by the memory controllers 113 and 115.

The blocking circuit 1530 may prevent the chip select signals CS<0:1> and the command address signals CA<0:13> transmitted by the memory controllers 113 and 115 from being transmitted to the memory chips 231 and 232 in response to activation of the blocking signals BLOCK_M0 and BLOCK_M1. When the first memory setting selection signal M0_SEL is activated, the blocking circuit 1530 may allow the first memory chip select signal CS<0>_M0 and the first memory command address signals CA<0:13>_M0 generated by the first memory setting value generation circuit 1510 to be transmitted to the memory chip 231, instead of the chip select signal CS<0> and the command address signals CA<0:13> transmitted by the memory controllers 113 and 115. When the second memory set selection signal M1_SEL is activated, the blocking circuit 1530 may allow the second memory chip select signal CS<1>_M1 and the second memory command address signals CA<0:13>_M1 generated by the second memory setting value generation circuit 1520 to be transmitted to the memory chip 232, instead of the chip select signal CS<1> and the command address signals CA<0:13> transmitted by the memory controllers 113 and 115.

The blocking circuit 1530 may include a blocking unit 1531 and a selection unit 1533. When one or more of the blocking signals BLOCK_M0 and BLOCK_M1 are activated, the blocking unit 1531 may deactivate all the chip select signals CS<0:1> transmitted from the setup and hold latch circuit 351 to the transmission control circuit 353 of the control signal transmission circuit 350. When the chip select signals CS<0:1> are deactivated, the command address signals CA<0:13> are treated as invalid. As a consequence, it can be seen that, when one or more of the blocking signals BLOCK_M0 and BLOCK_M1 are activated, the blocking circuit 1530 prevents the chip select signals CS<0:1> and the command address signals CA<0:13> from being transmitted to the memory chips 231 and 232.

When both the first memory setting selection signal M0_SEL and the second memory setting selection signal M1_SEL are deactivated, the selection unit 1533 may transmit signals output from the setup and hold latch circuit 351 to the transmission control circuit 353 as they are. When the first memory setting selection signal M0_SEL is activated, the selection unit 1533 may transmit the first memory chip select signal CS<0>_M0 and the first memory command address signals CA<0:13>_M0 generated by the first memory setting value generation circuit 1510 to the transmission control circuit 353, instead of the chip select signal CS<0> and the command address signals CA<0:13> transmitted from the setup and hold latch circuit 351. When the second memory setting selection signal M1_SEL is activated, the selection unit 1533 may transmit the second memory chip select signal CS<1>_M1 and the second memory command address signals CA<0:13>_M1 generated by the second memory setting value generation circuit 1520 to the transmission control circuit 353, instead of the chip select signal CS<1> and the command address signals CA<0:13> transmitted from the setup and hold latch circuit 351.

FIG. 15 illustrates an embodiment in which the first memory setting value generation circuit 1510, the second memory setting value generation circuit 1520, and the blocking circuit 1530 are added to the configuration of the buffer chip 220 in FIG. 9. Unlike this, it is of course that one memory setting value generation circuit and one blocking circuit may also be added to the configuration of the buffer chip 220 in FIG. 3.

Figure 16:
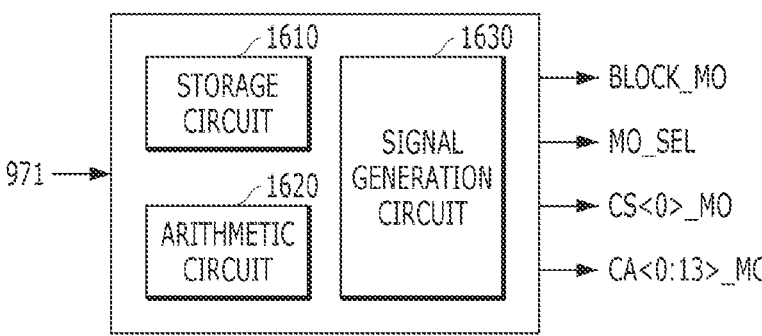
FIG. 16 is a configuration diagram of an embodiment of a first memory setting value generation circuit 1510 in FIG. 15.

FIG. 16 is a block diagram of an embodiment of the first memory setting value generation circuit 1510 in FIG. 15.

Referring to FIG. 16, the first memory setting value generation circuit 1510 may include a storage circuit 1610, an arithmetic circuit 1620, and a signal generation circuit 1630.

The storage circuit 1610 may store setting values of the first memory 231. Some of the setting values of the first memory 231 generated by the first memory setting value generation circuit 1510 may be stored in the storage circuit. For example, a level of a reference voltage suitable for the operation of the first memory 231, a resistance value of a driver, a termination resistance value of a buffer, and the like may be stored in the storage circuit 1610.

The arithmetic circuit 1620 may generate the setting values of the first memory 231 on the basis of setting values transmitted from the memory controllers 113 and 115. For example, when a setting value of the read latency RL transmitted from the memory controllers 113 and 115 is 32, the arithmetic circuit 1620 may calculate 32−4 to generate a setting value 28 of the read latency RL of the first memory 231, and when a setting value of the write latency WL transmitted from the memory controllers 113 and 115 is 28, the arithmetic circuit 1620 may calculate 28–4 to generate a setting value 24 of the write latency WL of the first memory 231.

Some of the setting values of the first memory 231 generated by the first memory setting value generation circuit 1510 may be generated by the storage circuit 1610 and the rest may be generated by the arithmetic circuit 1620.

The signal generation circuit 1630 may generate the first memory chip select signal CS<0>_M0 and the first memory command address signals CA<0:13>_M0 for setting the first memory to a setting value of the storage circuit 1610 or the calculation circuit 1620. The signal generation circuit 1630 may generate the first blocking signal BLOCK_M0 and the first memory setting selection signal M0_SEL.

The second memory setting value generation circuit 1520 may also have the same configuration as the first memory setting value generation circuit 1510.

Figure 17:
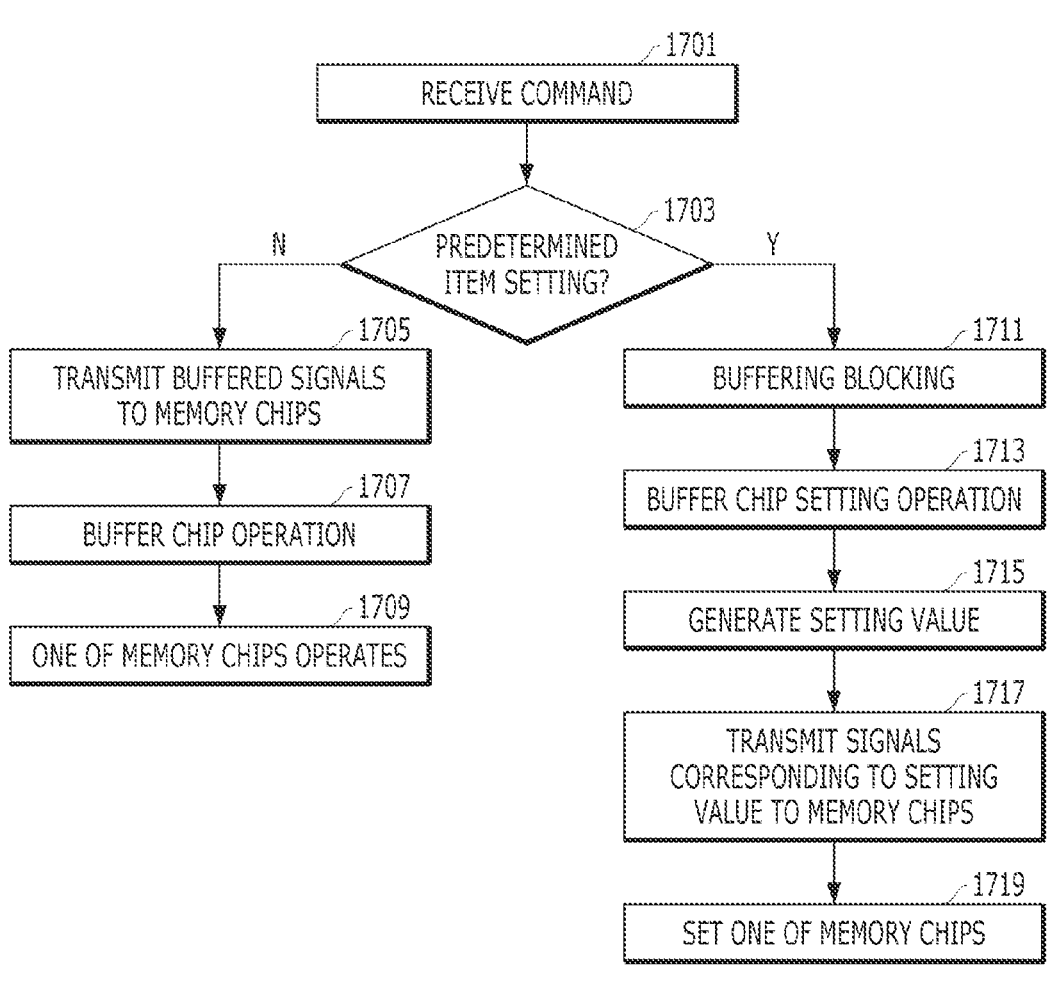
FIG. 17 is a flowchart illustrating an operation of the buffer chip 220 in FIG. 15.

FIG. 17 is a flowchart illustrating the operation of the buffer chip 220 in FIG. 15.

Referring to FIG. 17, the buffer chip 220 may receive a command from the memory controllers 113 and 115 (1701). The command may be transmitted from the memory controllers 113 and 115 to the buffer chip 220 through the chip select signals CS<0:1> and the command address signals CA<0:13>.

When the command received in step 1701 is not a command for setting a predetermined item (N in 1703), the buffer chip 220 may buffer the received chip select signals CS<0:1> and command address signals CA<0:13> and transmit the buffered signals to the memory chips 231 and 232 (1705).

Subsequently, the buffer chip 220 may perform an operation instructed by the command received in step 1701 (1707). Because the memory chips 231 and 232 also receive the command received in step 1701 from the buffer chip 220, one of the memory chips 231 and 232 may perform the operation instructed by the command received in step 1701 (1709).

When the command received in step 1701 is a command for setting the predetermined item (Y in 1703), one of the blocking signals BLOCK_M0 and BLOCK_M1 is activated by the first memory setting value generation circuit 1510 or the second memory setting value generation circuit 1520, so that the buffering operation of the buffer chip 220 may be blocked (1711). When the command received in step 1701 corresponds to the first memory chip 231, the first memory setting value generation circuit 1510 may operate, and when the command received in step 1701 corresponds to the second memory chip 232, the second memory setting value generation circuit 1520 may operate. On the other hand, one of the first setting circuit 981 and the second setting circuit 983 of the buffer chip 220 may perform a setting operation corresponding to the command received in step 1701 (1713). When the command received in step 1701 corresponds to the first memory chip 231, the first setting circuit 981 may operate, and when the command received in step 1701 corresponds to the second memory chip 232, the second setting circuit 983 may operate.

A setting value of one of the memory chips 231 and 232 may be generated by the first memory setting value generation circuit 1510 or the second memory setting value generation circuit 1520 of the buffer chip 220 (1715). When the command received in step 1701 corresponds to the first memory chip 231, the first memory setting value generation circuit 1510 may operate, and when the command received in step 1701 corresponds to the second memory chip 232, the second memory setting value generation circuit 1520 may operate.

The chip select signals M_CS<0:1> and the command address signals M_CA<0:13> for setting the setting value generated by the buffer chip 220 in step 1713 may be transmitted to the memory chips 231 and 232 (1717), and one of the memory chips 231 and 232 may be set to the value generated by the buffer chip 220 (1719). When the command received in step 1701 corresponds to the first memory chip 231, the first memory chip 231 may perform a setting operation, and when the command received in step 1701 corresponds to the second memory chip 232, the second memory chip 232 may perform a setting operation.

In summary, when the command transmitted to the buffer chip 220 is not a command for setting the predetermined item (N in 1703), the corresponding command may be transmitted from the buffer chip 220 to the memory chips 231 and 232 (1705). Subsequently, the buffer chip 220 and one of the memory chips 231 and 232 may perform an operation corresponding to the corresponding command (1707 and 1709).

When the command transmitted to the buffer chip 220 is a command for setting the predetermined item (Y in 1703), the corresponding command is not transmitted to the memory chips 231 and 232 (1711). A command newly generated by the buffer chip 220 is transmitted to the memory chips 231 and 232 (1715 and 1717). Accordingly, the buffer chip 220 may perform a setting operation corresponding to the command transmitted from the memory controllers 113 and 115 (1713), and one of the memory chips 231 and 232 may perform a setting operation corresponding to the command generated by the buffer chip 220 (1719). That is, the buffer chip 220 can be set to a value suitable for communication with the memory controllers 113 and 115, and the memory chips 231 and 232 can be set to a value suitable for communication with the buffer chip 220. For example, the write latency WL of the buffer chip 220 may be set to 30, and the write latency WL of the memory chips 231 and 232 may be set to 26.

Figure 18:
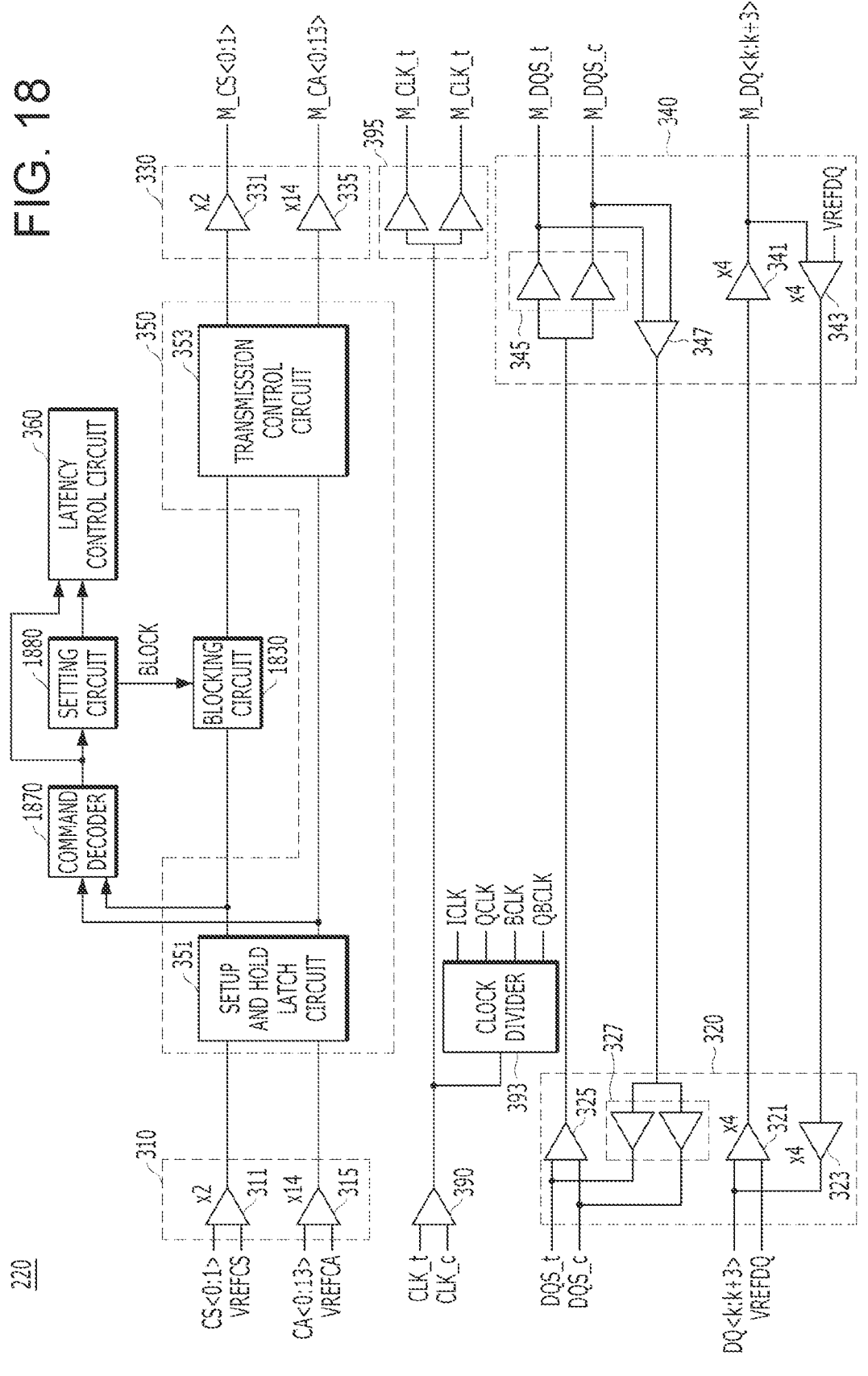
FIG. 18 is a block diagram of still another embodiment of the buffer chip 220 in FIG. 2.

FIG. 18 is a block diagram of still another embodiment of the buffer chip 220 in FIG. 2. In FIG. 18, an embodiment in which the buffer chip 220 and the memory chips 231 and 232 can be set to different setting values by using the setting of a command blocking mode and the setting of a setting bypass mode will be described.

Referring to FIG. 18, the buffer chip 220 may include the external control signal interface 310, the external data interface 320, the internal control signal interface 330, the internal data interface 340, the control signal transmission circuit 350, the latency control circuit 360, a command decoder 1870, a setting circuit 1880, the clock reception circuit 390, the clock divider 393, the clock transmission circuit 395, and a blocking circuit 1830.

The command decoder 1870 may decode the chip select signals CS<0:1> and the command address signals CA<0:13> received through the external control signal interface 310. The command decoder 1870 may receive and decode control signals latched by the setup and hold latch circuit 351 after being received by the external control signal interface 310. Because FIG. 18 illustrates that a command decoder is not provided for each of the chip select signals CS<0:1> and one command decoder 1870 is provided, when even one of the chip select signals CS<0:1> is activated to a low level, the command decoder 1870 may determine that the command address signals CA<0:13> are valid and decode the command address signals CA<0:13>. The command decoder 1870 may find out instructions for entering and exiting a command blocking mode and instructions for entering and exiting a setting bypass mode through the decoding operation.

The setting circuit 1880 may further perform a setting operation of the command blocking mode and the setting bypass mode in addition to the setting operation performed by the setting circuit 380 in FIG. 3.

The command blocking mode may be a mode in which a command is prevented from being transmitted to the memory chips 231 and 232. That is, when the command blocking mode is set, the chip select signals CS<0:1> and the command address signals CA<0:13> might not be transmitted to the memory chips 231 and 232. When the command blocking mode is set, the setting circuit 1880 may activate a blocking signal BLOCK. When the blocking signal BLOCK is activated, the blocking circuit 1830 may deactivate all the chip select signals CS<0:1> transmitted from the setup and hold latch circuit 351 to the transmission control circuit 353 of the control signal transmission circuit 350. When the chip select signals CS<0:1> are deactivated, the command address signals CA<0:13> are treated as invalid. As a consequence, it can be said that when the blocking signal BLOCK is activated, the blocking circuit 1830 prevents the chip select signals CS<0:1> and the command address signals CA<0:13> from being transmitted to the memory chips 231 and 232.

The setting bypass mode may be a mode in which the setting of the buffer chip 220 is prevented. When the setting bypass mode is set, the setting circuit 1880 might not perform the setting operation. The setting circuit 1880 maintains the setting values set before the setting of the setting bypass mode as they are, but might not perform a new setting operation any more when the setting bypass mode is set. When exiting the setting bypass mode, the setting circuit 1880 may perform the setting operation again.

By setting the command blocking mode, the buffer chip 220 can be set regardless of the settings of the memory chips 231 and 232. By setting the setting bypass mode, the memory chips 231 and 232 can be set regardless of the settings of the buffer chip 220. That is, the buffer chip 220 and the memory chips 231 and 232 may be set to different setting values by using the command blocking mode and the setting bypass mode.

FIG. 19 is a flowchart illustrating operations related to the command blocking mode and the setting bypass mode of the buffer chip 220 in FIG. 18.

Referring to FIG. 19, the buffer chip 220 may receive a first command from the memory controllers 113 and 115 (1901). For example, the buffer chip 220 may receive a setting command of setting the level of a reference voltage A to B.

One of the memory chips 231 and 232 (one selected by the chip select signal) and the buffer chip 220 may perform an operation corresponding to the first command received in step 1901 (1903). For example, the level of the reference voltage A used by the memory chip 231 may be set to B, and the level of the reference voltage A used by the buffer chip may be set to B.

The buffer chip 220 may receive a second command of instructing entry into the command blocking mode from the memory controllers 113 and 115 (1905). Accordingly, the buffer chip 220 may enter the command blocking mode (1907). Because the command blocking mode has been set, no command might be transmitted to the memory chips 231 and 232.

The buffer chip 220 may receive a third command from the memory controllers 113 and 115 (1909). For example, the buffer chip 220 may receive a setting command of setting the write latency WL to 30.

The buffer chip 220 may perform an operation corresponding to the third command (1911). For example, the write latency WL of the buffer chip 220 may be set to 30.

The buffer chip 220 may receive a fourth command of instructing exit from the command blocking mode from the memory controllers 113 and 115 (1913). Accordingly, the buffer chip 220 may exit the command blocking mode (1915). A command may be transmitted to the memory chips 231 and 232 again.

The buffer chip 220 may receive a fifth command of instructing entry into the setting bypass mode (1917). Accordingly, the buffer chip 220 may enter the setting bypass mode (1919). The setting circuit 1880 of the buffer chip 220 might not perform the setting operation.

The buffer chip 220 may receive a sixth command, which is a setting command, from the memory controllers 113 and 115 (1921). For example, the buffer chip 220 may receive a setting command of setting the write latency WL of the memory chip 231 to 26.

The memory chip 231 may perform a setting operation according to the sixth command (1923). For example, the write latency WL of the memory chip 231 may be set to 26.

The buffer chip 220 may receive a seventh command, which is a setting command, from the memory controllers 113 and 115 (1925). For example, the buffer chip 220 may receive a setting command of setting the write latency WL of the memory chip 232 to 26.

The memory chip 232 may perform a setting operation by the seventh command (1927). For example, the write latency WL of the memory chip 232 may be set to 26.

The buffer chip 220 may receive an eighth command of instructing exit from the setting bypass mode (1929). Accordingly, the setting bypass mode of the buffer chip 220 may end (1931).

As illustrated in FIG. 19, by using the command blocking mode and the setting bypass mode, the write latency WL of the buffer chip 220 can be set to 30 and the write latency WL of the memory chips 231 and 232 can be set to 26 differently from the buffer chip 220.

Introduction of a dedicated command is conceivable as another method for setting the buffer chip 220 and the memory chips 231 and 232 to different setting values. For example, a buffer setting command and a memory setting command may be used.

When the buffer setting command is applied to the buffer chip 220 from the memory controllers 113 and 115, only the buffer chip 220 responds to the buffer setting command and the memory chips 231 and 232 may ignore the buffer setting command. That is, even though the buffer setting command is transmitted to the memory chips 231 and 232, the memory chips 231 and 232 may ignore the buffer setting command. Accordingly, only the buffer chip 220 may perform a setting operation in response to the buffer setting command.

When the memory setting command is applied from the memory controllers 113 and 115 to the buffer chip 220, the buffer chip 220 performs only a buffering operation, and the command decoder 1870 and the setting circuit 1880 of the buffer chip 220 might not respond to the memory setting command. The memory chips 231 and 232 may perform a setting operation in response to the memory setting command transmitted from the buffer chip 220.

The buffer chip 220 and the memory chips 231 and 232 may be easily set to different setting values by defining and using the buffer setting command that is a dedicated command for setting only the buffer chip 220, and the memory setting command that is a dedicated command for setting only the memory chips 231 and 232.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A semiconductor package comprising:
   a package substrate comprising a plurality of terminals and a plurality of bonding pads;
   a buffer chip attached to the package substrate and communicating with a memory controller through the plurality of terminals;
   a plurality of memory chips stacked on the buffer chip; and
   a plurality of wires connecting the plurality of bonding pads and the plurality of memory chips,
   wherein the plurality of memory chips communicate with the buffer chip through the plurality of wires and the plurality of bonding pads.

2. The semiconductor package of claim 1, wherein the buffer chip is configured to:
   buffer control signals received from the memory controller; and
   transmit the buffered control signals to the plurality of memory chips;
   buffer data received from the memory controller;
   transmit buffered data to the plurality of memory chips during a write operation;
   buffer data received from the plurality of memory chips; and
   transmit buffered data to the memory controller during a read operation.

3. The semiconductor package of claim 2, wherein the control signals include command address signals and chip select signals,
   the command address signals are transmitted in common to the plurality of memory chips, and
   the chip select signals correspond to the plurality of memory chips in a one-to-one manner.

4. The semiconductor package of claim 3, wherein the buffer chip comprises:
   a command address reception circuit configured to the command address signals transmitted from the memory controller;
   a chip select signal reception circuit for receiving the chip select signals transmitted from the memory controller;
   a control signal transmission circuit configured to transmit the command address signals received by the command address reception circuit, and transmit the chip select signals received by the chip select signal reception circuit;

a command address transmission circuit configured to transmit the command address signals transmitted from the control signal transmission circuit to the plurality of memory chips; and
   a chip select signal transmission circuit configured to transmit the chip select signals transmitted from the control signal transmission circuit to corresponding memory chips.

5. The semiconductor package of claim 4, wherein the buffer chip further comprises:
   an external data reception circuit configured to receive data transmitted from the memory controller;
   an internal data transmission circuit configure to transmit the data received by the external data reception circuit to the plurality of memory chips;
   an internal data reception circuit configured to receive data transmitted from the plurality of memory chips; and
   an external data transmission circuit configured to transmit data received by the internal data reception circuit to the memory controller.

6. The semiconductor package of claim 5, wherein the buffer chip further comprises:
   a command decoder that decodes the command address signals received by the command address reception circuit and the chip select signals received by the chip select signal reception circuit;
   a setting circuit configure to perform a setting operation according to a decoding result of the command decoder; and
   a latency control circuit that activates the external data reception circuit and the internal data transmission circuit during a write operation, and activates the internal data reception circuit and the external data transmission circuit during a read operation.

7. The semiconductor package of claim 6, wherein the latency control circuit is configured to activate the external data reception circuit and configured to activate the internal data transmission circuit such that data transmitted from the memory controller to the buffer chip is received after a write latency set by the setting circuit starting a time when a write command is applied to the buffer chip, and which activates the internal data reception circuit and the external data transmission circuit so that data is transmittable from the buffer chip to the memory controller after a read latency set by the setting circuit from a time point when a read command is applied to the buffer chip.

8. The semiconductor package of claim 5, wherein the buffer chip further comprises:
   an external data strobe reception circuit configured to receive a data strobe signal transmitted from the memory controller;
   an internal data strobe transmission circuit configured to transmit the data strobe signal received by the external data strobe reception circuit to the plurality of memory chips;
   an internal data strobe reception circuit configured to receive a data strobe signal transmitted from the plurality of memory chips; and
   an external data strobe transmission circuit configured to transmit the data strobe signal received by the internal data strobe reception circuit to the memory controller.

\* \* \* \* \*